United States Patent
Cheung et al.

(10) Patent No.: US 11,577,956 B2
(45) Date of Patent: Feb. 14, 2023

(54) OZONE-MEDIATED SYNTHESIS OF NANOSTRUCTURES

(71) Applicant: NUtech Ventures, Lincoln, NE (US)

(72) Inventors: Chin Li Cheung, Lincoln, NE (US); Christopher Mark Marin, South Park, PA (US); Anuja Bhalkikar, Lincoln, NE (US); Tamra Fisher, Lincoln, NE (US)

(73) Assignee: NUtech Ventures, Lincoln, NE (US)

(*) Notice: Subject to any disclaimer, the term of this patent is extended or adjusted under 35 U.S.C. 154(b) by 298 days.

(21) Appl. No.: 16/384,829

(22) Filed: Apr. 15, 2019

(65) Prior Publication Data

US 2019/0315629 A1     Oct. 17, 2019

Related U.S. Application Data

(60) Provisional application No. 62/657,187, filed on Apr. 13, 2018.

(51) Int. Cl.
| | |
|---|---|
| *C01B 13/36* | (2006.01) |
| *C30B 7/14* | (2006.01) |
| *C30B 29/16* | (2006.01) |
| *C01G 45/02* | (2006.01) |
| *C01G 5/00* | (2006.01) |

(Continued)

(52) U.S. Cl.
CPC .......... *C01B 13/363* (2013.01); *C01F 17/224* (2020.01); *C01F 17/235* (2020.01); *C01F 17/241* (2020.01); *C01G 5/00* (2013.01); *C01G 45/02* (2013.01); *C01G 51/04* (2013.01); *C01G 55/004* (2013.01); *C30B 7/14* (2013.01); *C30B 29/16* (2013.01); *B82Y 30/00* (2013.01); *C01P 2002/01* (2013.01); *C01P 2002/30* (2013.01); *C01P 2002/60* (2013.01); *C01P 2002/72* (2013.01); *C01P 2004/04* (2013.01); *C01P 2004/64* (2013.01)

(58) Field of Classification Search
None
See application file for complete search history.

(56) References Cited

U.S. PATENT DOCUMENTS

| | | | | |
|---|---|---|---|---|
| 3,425,793 A | * | 2/1969 | Lindstrom | C01F 17/235 423/21.1 |
| 4,954,321 A | * | 9/1990 | Jensen | C01B 13/11 422/186.19 |

OTHER PUBLICATIONS

Chen et al. (Homogeneous precipitation of cerium dioxide nanoparticles in alcohol/water mixed solvents, Colloids and Surfaces A: Physicochem. Eng. Aspects 242 (2004) 61-69) (Year: 2004).*

(Continued)

*Primary Examiner* — Colin W. Slifka
*Assistant Examiner* — Michael Forrest
(74) *Attorney, Agent, or Firm* — Fish & Richardson P.C.

(57) ABSTRACT

A method of producing ceria nanocrystals is provided. The method includes providing a gas that includes ozone to a solution that includes a cerium salt, and obtaining ceria nanocrystals from the solution after the gas is provided to the first solution. A method of producing nanoparticles is provided. The method includes providing a gas that includes ozone to a solution that includes a metal salt that includes at least one of a transition metal or a lanthanide, and producing at least one of metal oxide nanoparticles, metal oxynitrate nanoparticles, or metal oxyhydroxide nanoparticles from the solution after the gas is provided to the solution.

17 Claims, 31 Drawing Sheets

(51) Int. Cl.
- C01G 51/04 (2006.01)
- C01G 55/00 (2006.01)
- C01F 17/224 (2020.01)
- C01F 17/235 (2020.01)
- C01F 17/241 (2020.01)
- B82Y 30/00 (2011.01)

(56) References Cited

OTHER PUBLICATIONS

Bauer et al. (Recovery of Cerium and Lanthanum by Ozonation of Lanthanide Solutions, Bureau of Mines Report of Investigations 7123 (1968) pp. 1-9). (Year: 1968).*

Adachi et al., "Synthesis and modification of ceria-based materials," Catalysis by Ceria and Related Materials, 2011, 51-83.

Barbusinski, "Fenton reaction—Controversy concerning the chemistry," Ecol. Chem. Eng. S. 2009, 16(3):347-358.

Bartosz et al., "Generation of reactive oxygen species in biological systems," J. Toxicol. Environ. Health B Crit. Rev., 2003, 9(1):5-21.

Boaro et al., "The use of ceria in FCC, dehydrogenation and other catalytic applications," Catalysis by Ceria and Related Materials, Imperial College Press, 2011, 483-500.

Bokare et al. "Review of iron-free Fenton-like systems for activating H2O2 in advanced oxidation processes," J. Hazard. Mater., 2014, 275:121-135.

Chen et al., "Hydrothermal synthesis of ceria hybrid architectures of nano-rods and nanooctahedrons," Mater. Lett. 2013, 96:210-213.

Chen et al., Various physicochemical and surface properties controlling the bioactivity of cerium oxide nanoparticles. Crit. Rev. Biotechnol, 2018, 38(7):1003-1024.

Dickinson et al., "Chemistry and biology of reactive oxygen species in signaling or stress responses," Nat. Chem. Biol., 2011, 7(8):504-511.

Fisher et al., "Structure activity relationship of nanostructured ceria for the catalytic generation of hydroxyl radicals," Nanoscale, 2019, 11:4554-4561.

Gligorovski et al., "Environmental implications of hydroxyl radicals (•OH)," Chem. Rev., 2015, 115(24):13051-13092.

Heckert et al., "Fenton-like reaction catalyzed by the rare earth inner transition metal cerium," Environ. Sci. Technol., 2008, 42(13):5014-5019.

Johnson et al., "Probes for reactive oxygen species, including nitric oxide. In The molecular probes handbook—A guide to fluorescent probes and labeling technologies, 11 ed.," Eds. Life Technologies, 2010, 805-828.

Kurajica et al., "High surface area ceria nanoparticles via hydrothermal synthesis experiment design," J. Nanomaterials. 2016, 2016:8.

Lair et al., "Synthesis and characterization of cerium oxide by electrochemical methods," Phys. Status. Solidi C, 2008, 5(11):3492-3495.

Li et al., "Hot topics and challenges of regenerative nanoceria in application of antioxidant therapy," J. Nanomaterials 2018, 2018(12):4857461.

Mittler et al., "ROS Are good," Trends Plant Sci., 2017, 22(1):11-19.

Nosaka et al., "Generation and detection of reactive oxygen species in photocatalysis," Chem. Rev., 2017, 117(17):11302-11336.

Primet et al., "Fundamentals and applications of ceria in combustion reactions," Catalysis by Ceria and Related Materials, 2011, 407-429.

Saikia et al., "A simple chemical route toward high surface area CeO2 nanoparticles displaying remarkable radical scavenging activity," ChemistrySelect, 2017, 2 (11):3369-3375.

Setsukinai et al., "Development of novel fluorescence probes that can reliably detect reactive oxygen species and distinguish specific species," J. Biol. Chem. 2003, 278:3170-3175.

Sharpe et al., "Artificial nanoparticle antioxidants. In Oxidative stress: Diagnostics, prevention, and therapy," American Chemical Society, 2011, 1083:235-253.

Shelef et al., "Ceria and other oxygen storage components in automotive catalysis," Catalysis by Ceria and Related Materials, 2011, 343-375.

Soh et al., "Ceria—zirconia nanoparticles as an enhanced multi-antioxidant for sepsis treatment," Angew. Chem. Int. Ed., 2017, 56 (38):11399-11403.

Xu et al., "Cerium oxide nanoparticle: A remarkably versatile rare earth nanomaterial for biological applications," NPG Asia Mater., 2014, 6:e90.

Yang et al., "Hydrothermal synthesis of monodisperse CeO2 nanocubes," Mater. Lett., 2009, 63(21):1774-1777.

* cited by examiner

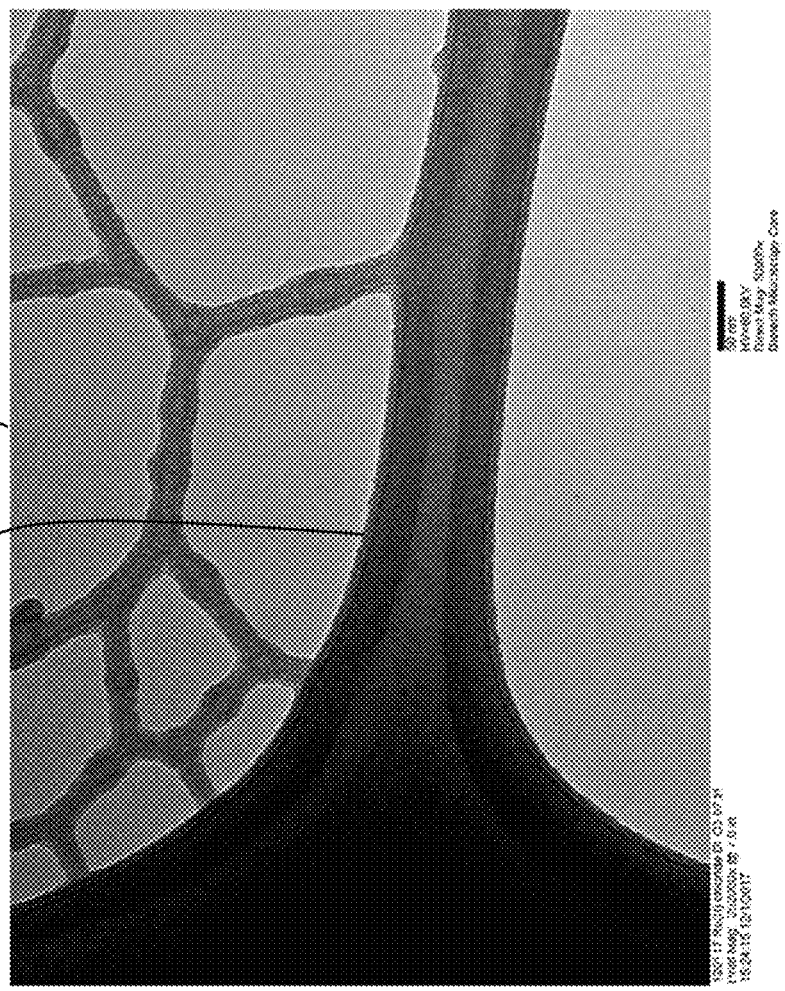
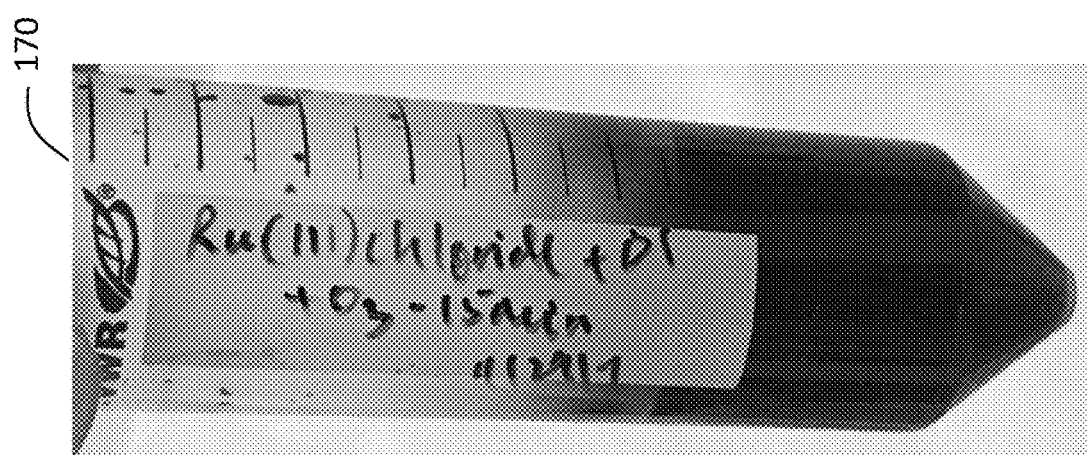
FIG. 5B
FIG. 5A

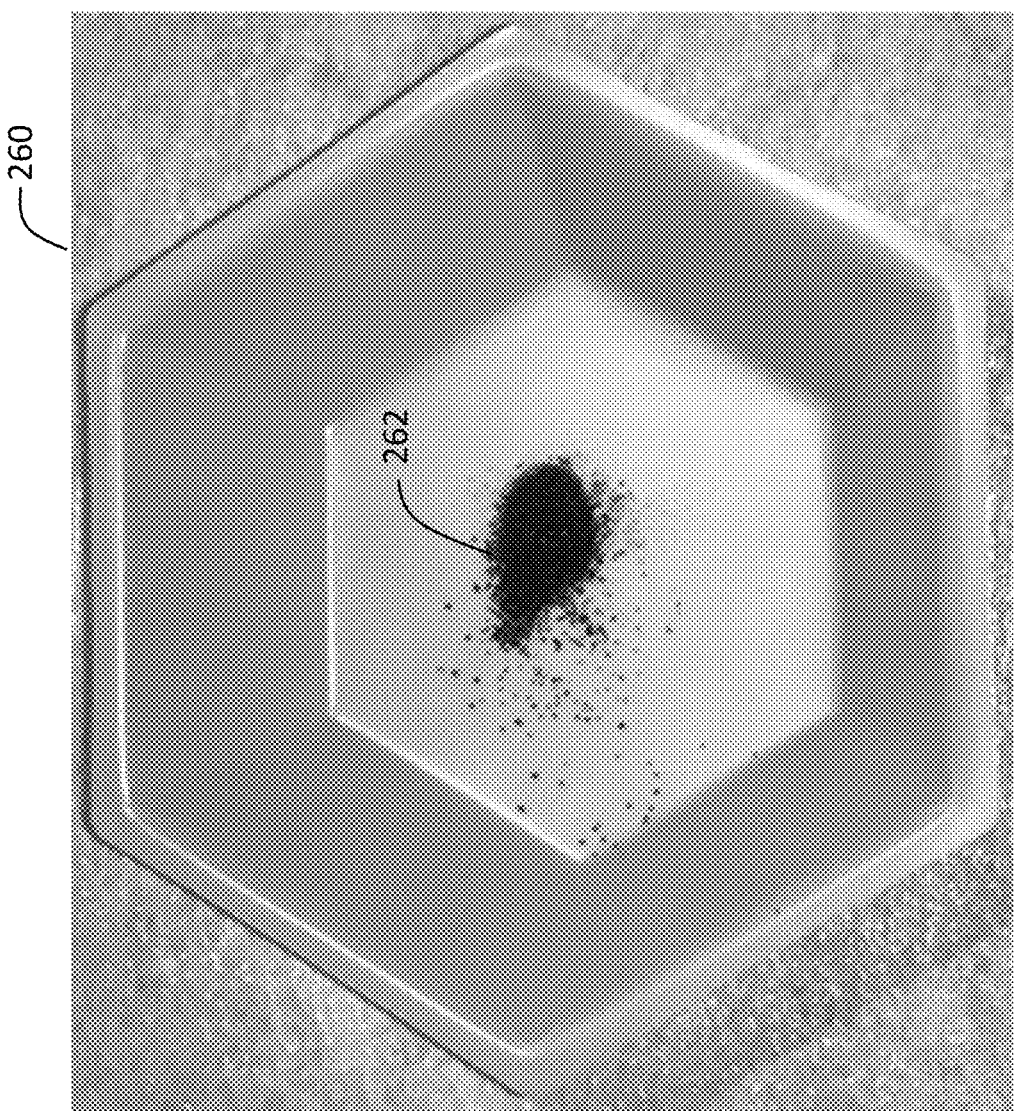
Fig. 14 Photo of a sample of dry, as-synthesized ceria nanocrystals

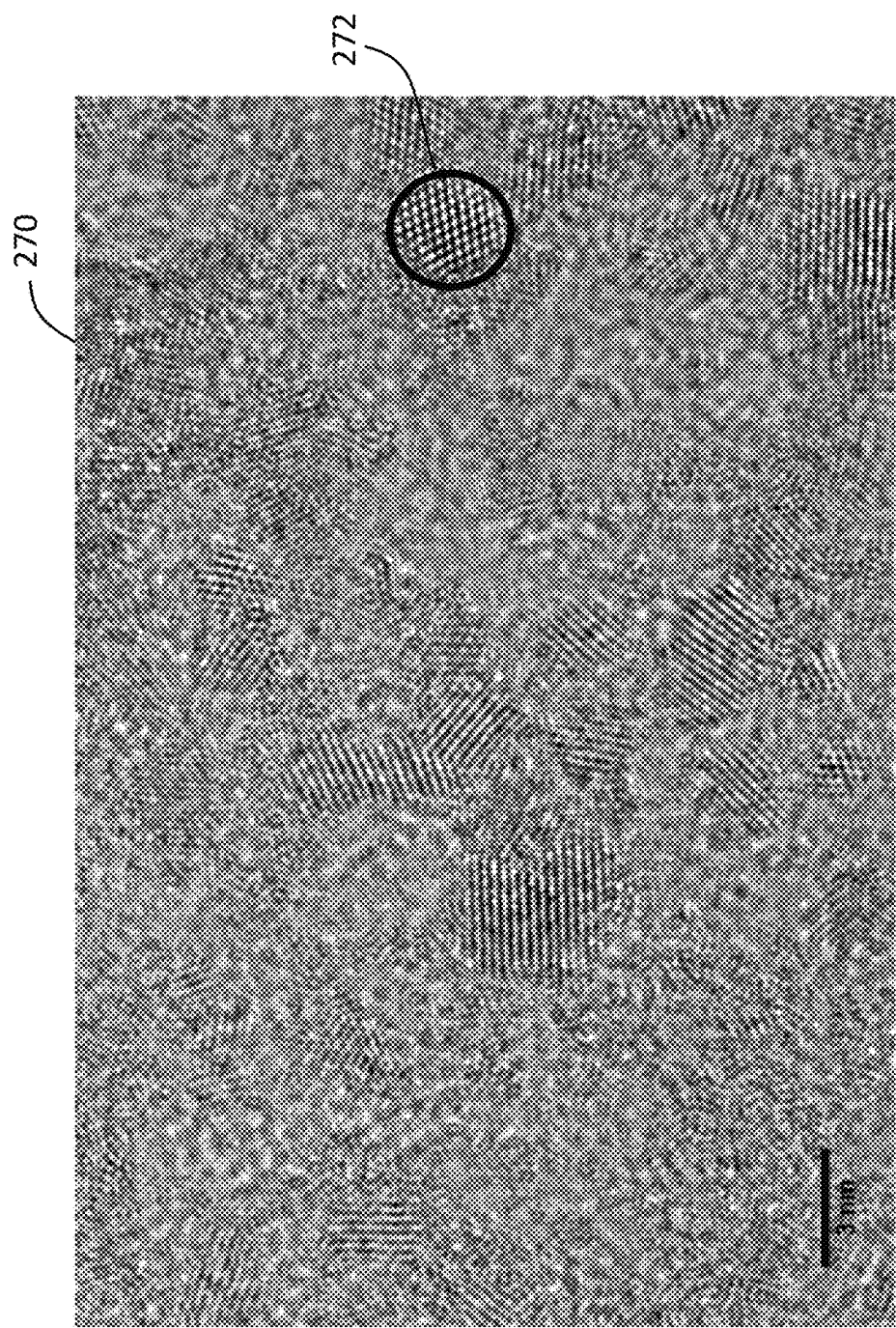
Fig. 15 HRTEM image of the as-synthesized ceria nanocrystals obtained after ozonating an ethanol solution of cerium (III) nitrate hexahydrate for 15 seconds. The circle shows one ceria nanocrystal.

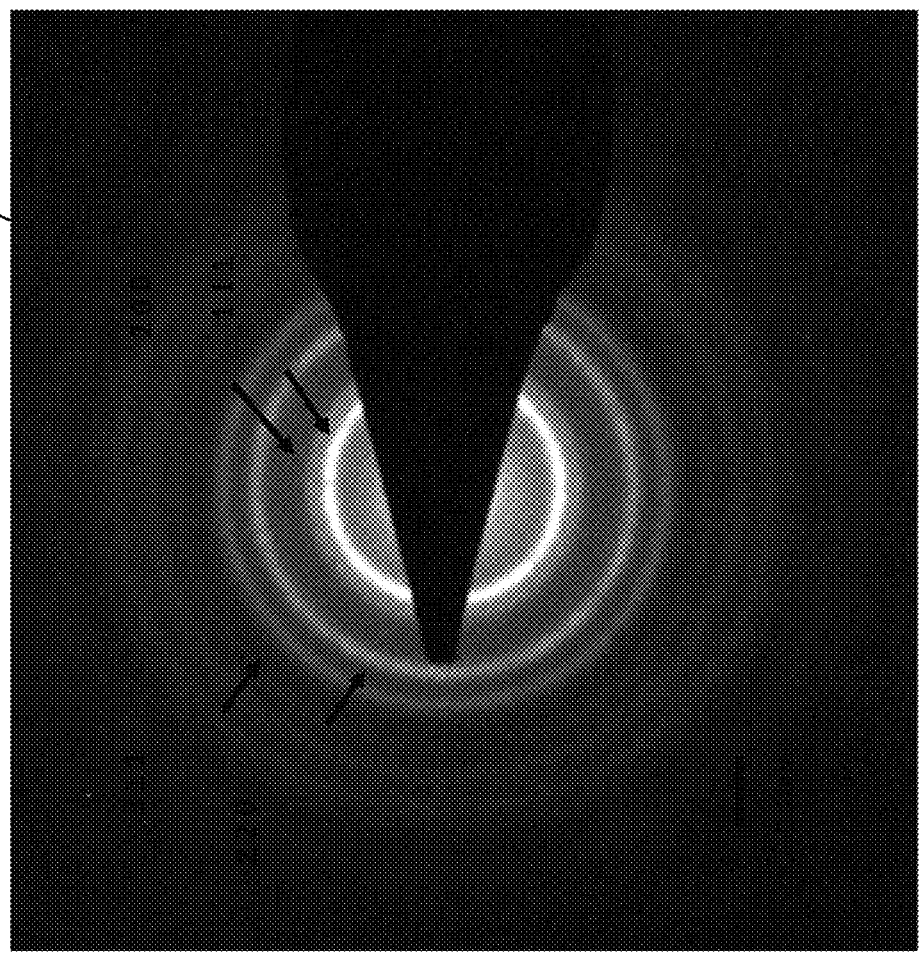
Fig. 16. SAED pattern of ceria NPs shown in Fig. 2.

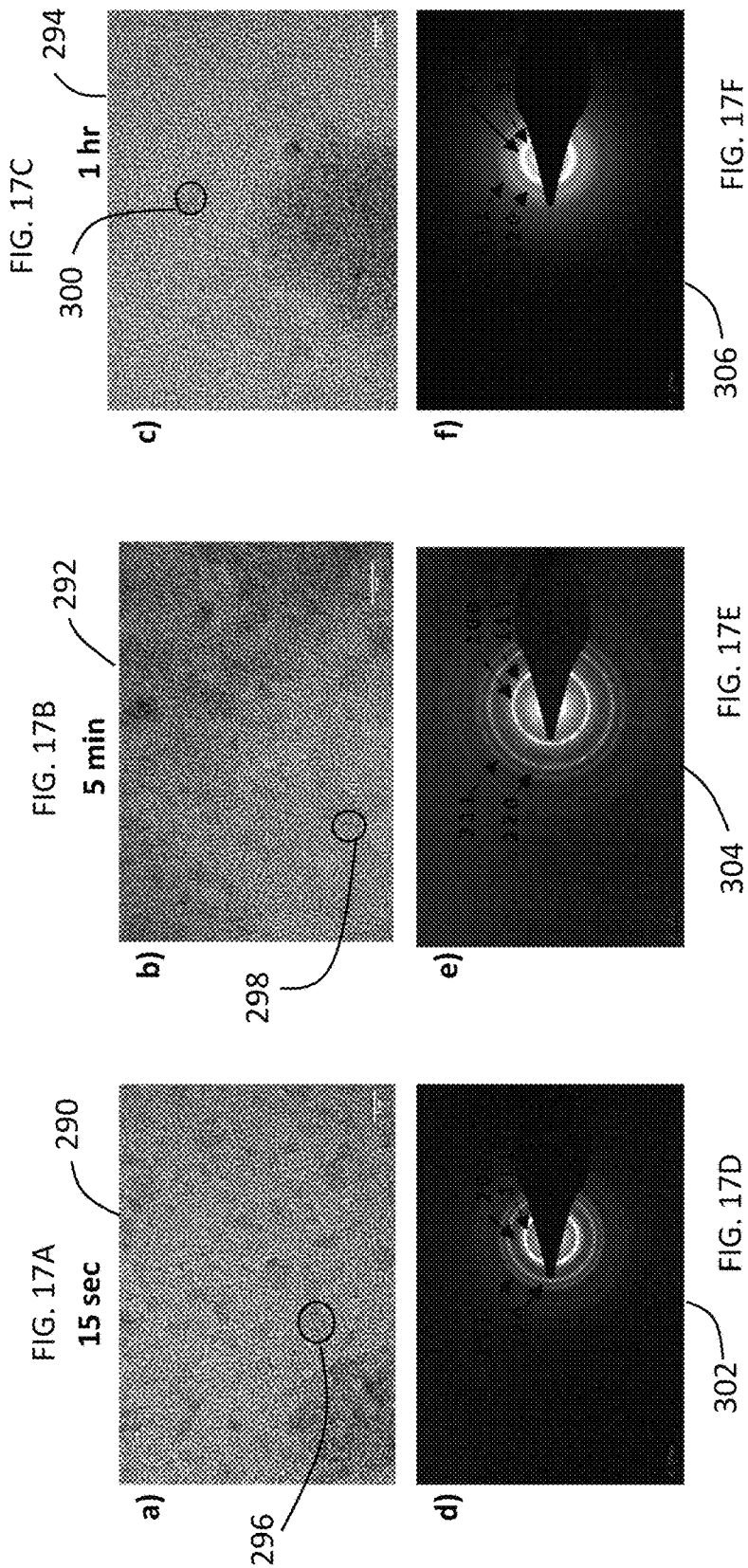

Fig. 17 a, b & c. HRTEM of ceria NPs conducted at different time points (15 sec, 5min & 1hr respectively) – The scale bar on the images is 5 nm. HRTEM analysis revealed that the sizes of the nanocrystals remained around 2 - 5nm even on changing the ozonation time (i.e. 15 sec, 5min & 1hr). Individual nanocrystals are circled for clarity.

Fig. 17d, e & f. SAED analysis of ceria NPs conducted at different time points (15 sec, 5min & 1hr respectively) – The scale bar on the images is 2 1/nm. SAED analysis showed the products as fluorite structured cerium oxide.

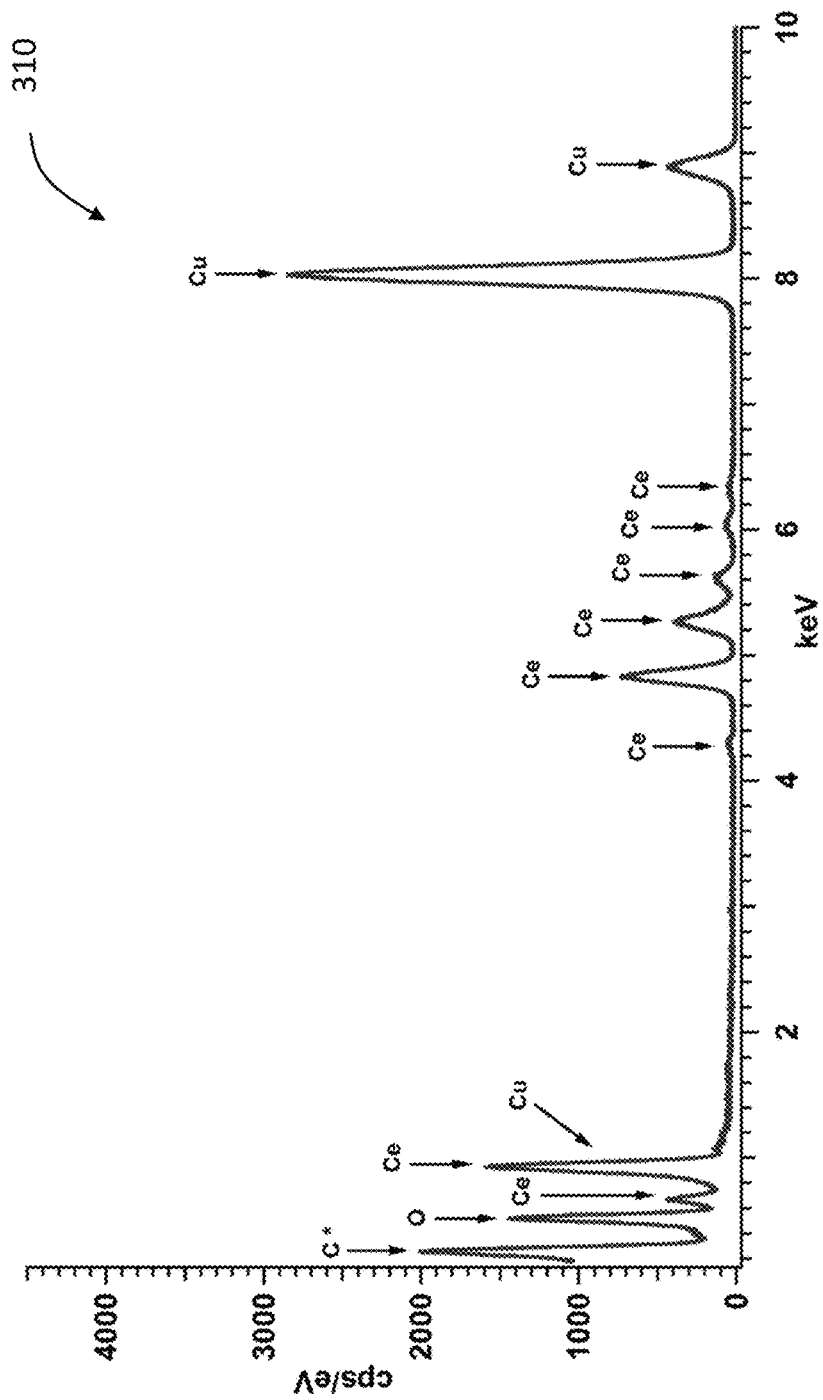
Fig.18 Representative EDS spectra of ceria nanoparticles - The EDS spectra shows the presence of C, O, Ce and Cu. The Cu & C signal is from the carbon film present on the Cu TEM grid.

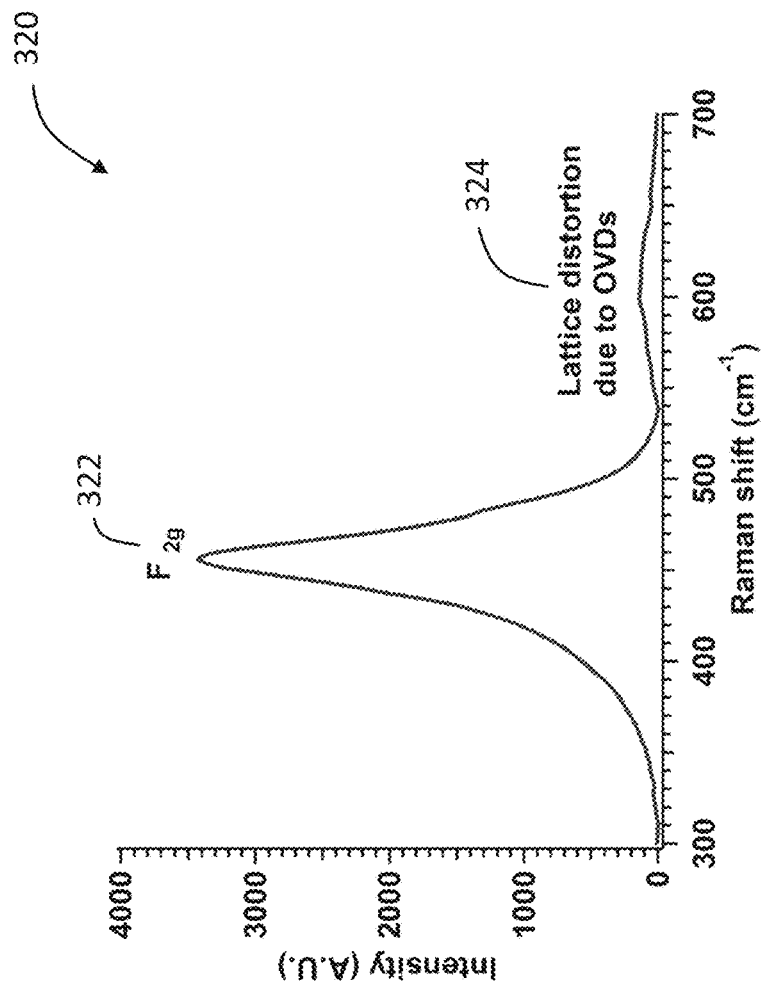
Fig. 19 Raman spectrum of ceria NPs - The mode near 450 cm⁻¹ represents the first order Raman active $F_{2g}$ mode of fluorite structured ceria. The mode near 600 cm⁻¹ can be attributed to oxygen vacancy defects present in the ceria nanoparticles.

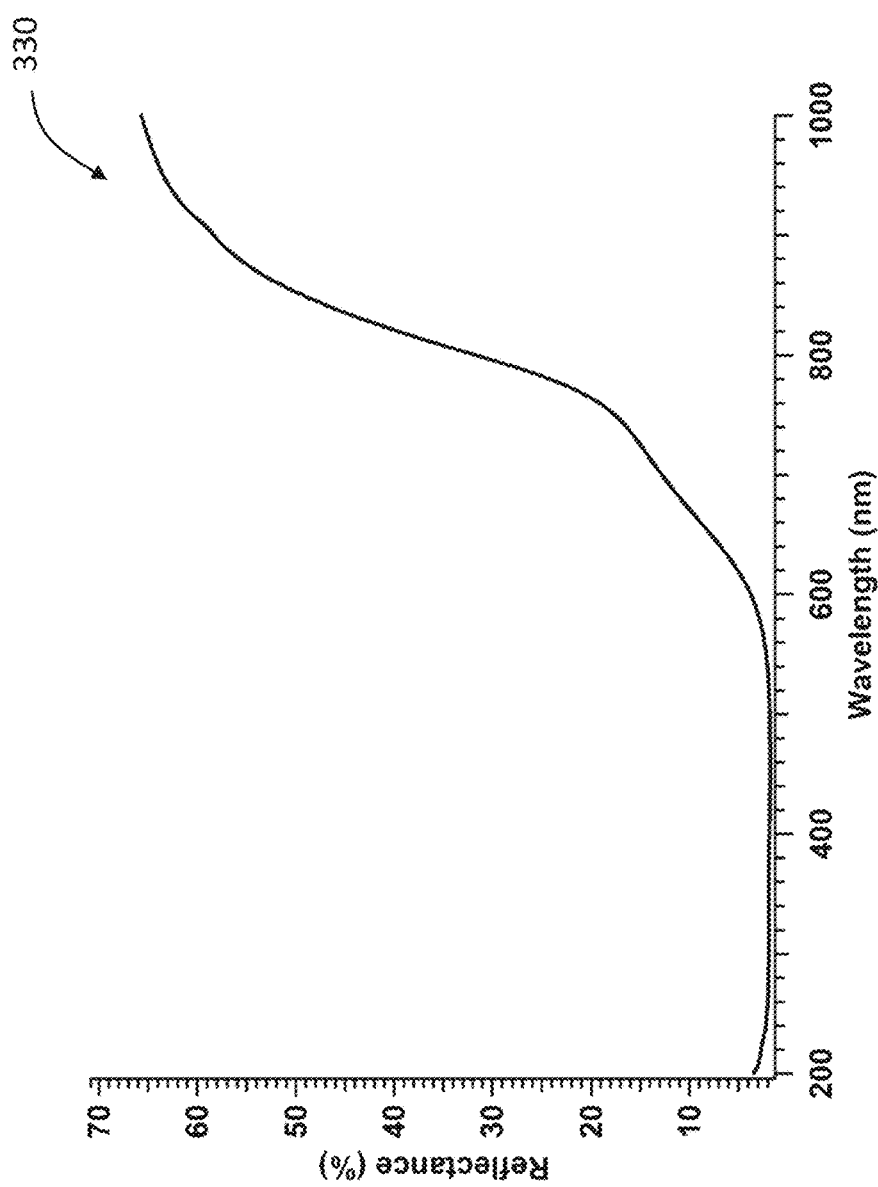
Fig. 20 Diffuse reflectance spectrum of ceria NPs - The NPs were synthesized by bubbling ozone in the ethanolic solution of cerium nitrate for 30 minutes. The change of reflectance above 540 nm indicates that the NPs are red in color.

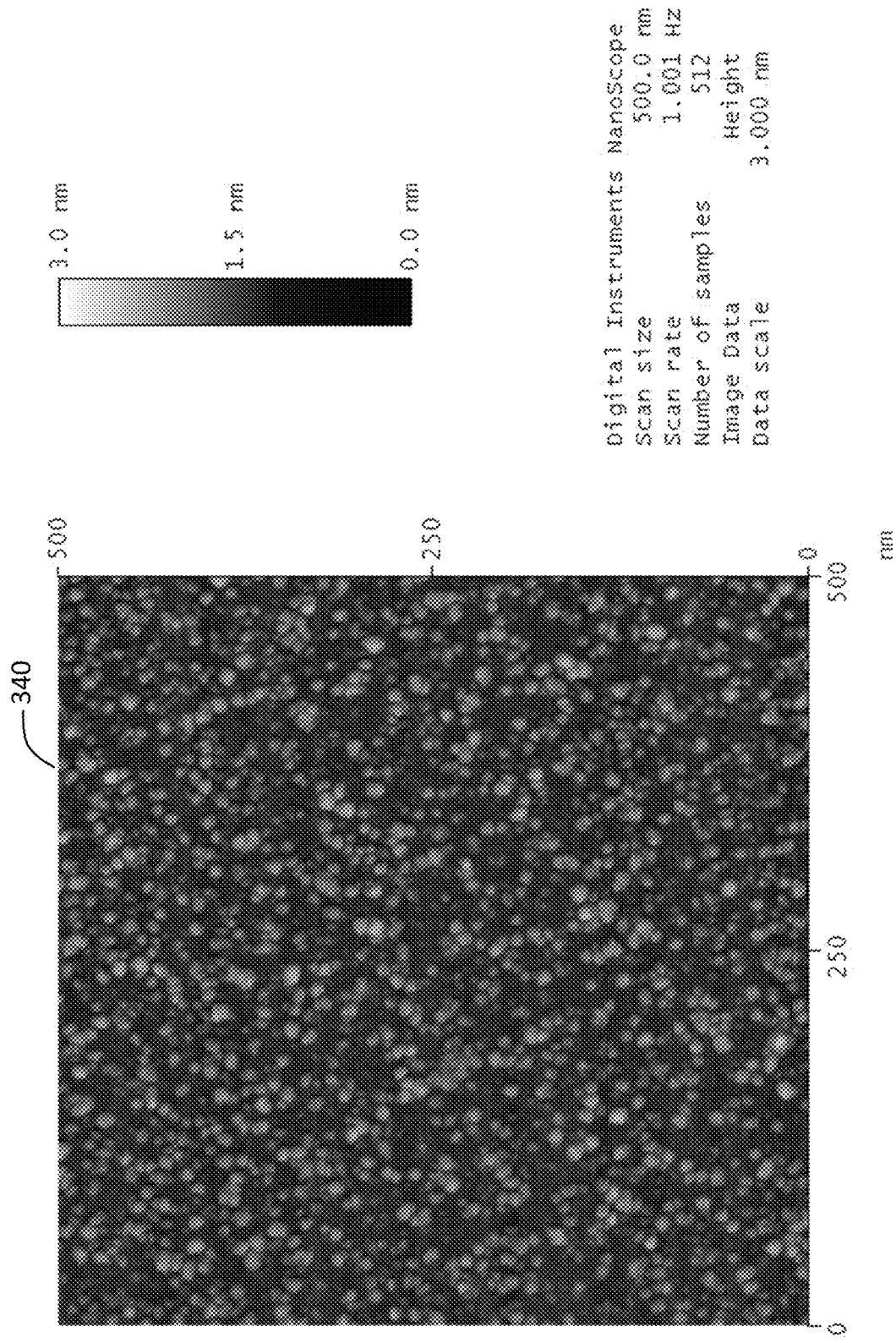
FIG. 21 Atomic force microscopy image of birnessite ($M_xMnO_2 \cdot nH_2O$ ($M = H^+$)) nanoparitles and aggregates made by ozonating an manganese salt solution.

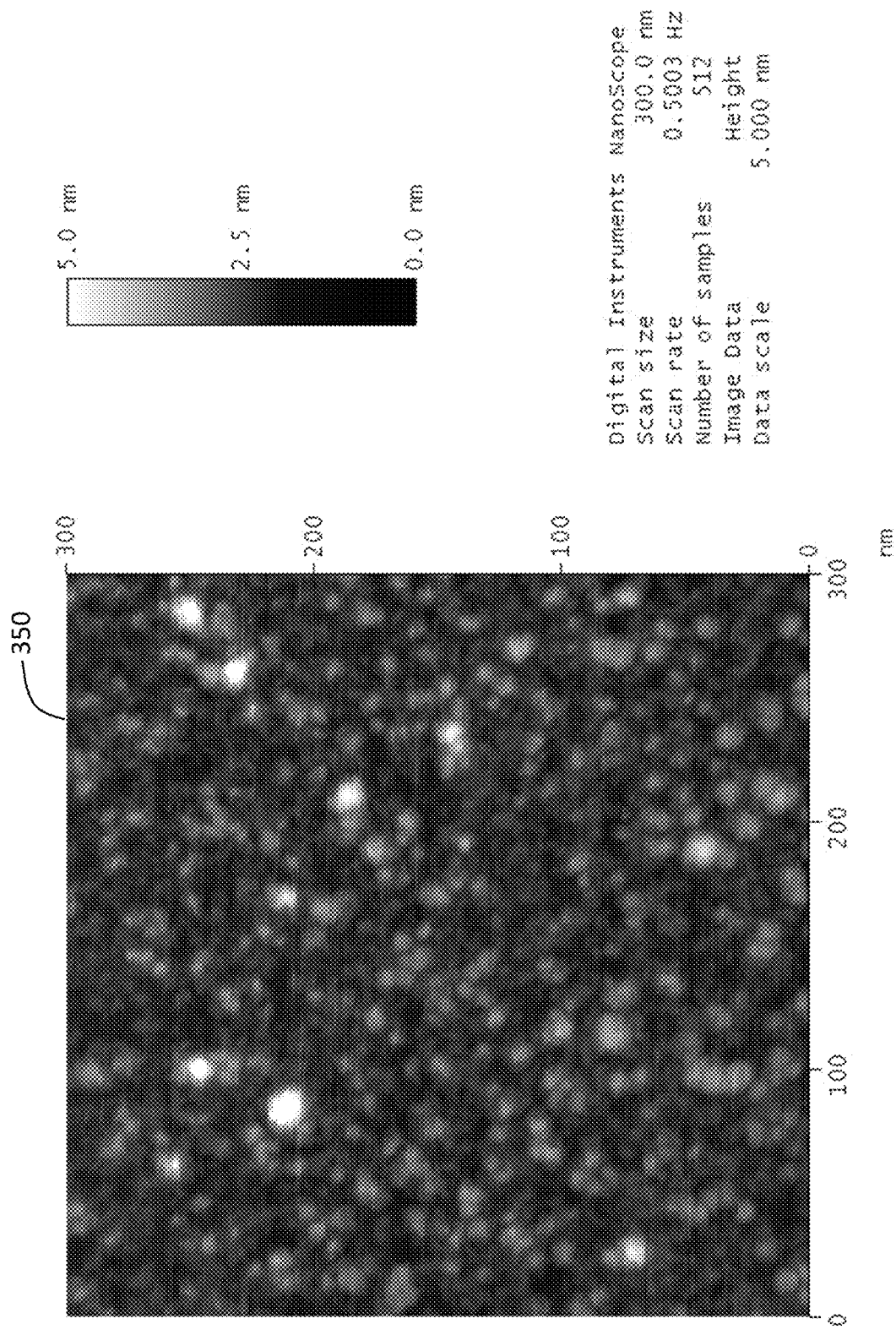
FIG. 22 Atomic force microscopy image of silicon oxide nanoparticles and aggregates made by ozonating an ethanol solution of tetraethoxysilane (TEOS).

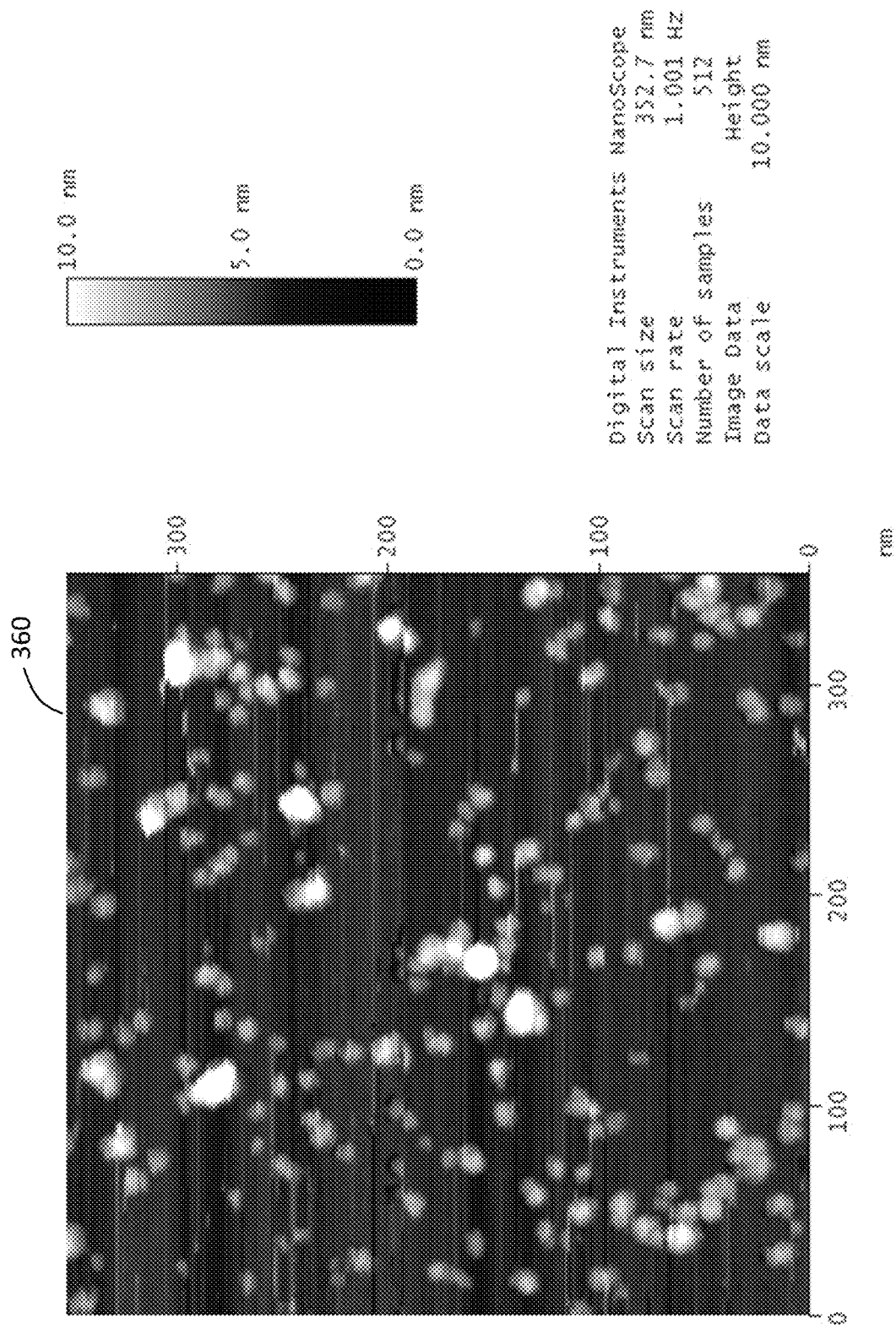
FIG. 23 Atomic force microscopy image of ruthenium oxide nanoparticles and aggregates made by ozonating an aqueous solution of ruthenium chloride.

OZONE-MEDIATED SYNTHESIS OF NANOSTRUCTURES

CROSS-REFERENCE TO RELATED APPLICATION

This application claims priority to U.S. provisional application 62/657,187, filed on Apr. 13, 2018, the entire content of which is incorporated by reference.

STATEMENT AS TO FEDERALLY SPONSORED RESEARCH

This invention was made with government support under CHE1362916 awarded by the National Science Foundation. The government has certain rights in the invention.

TECHNICAL FIELD

This subject matter is generally related to ozone-mediated synthesis of nanostructures.

BACKGROUND

Transition metal oxides and lanthanide oxides (inner transition metal oxides) are commercially valuable oxides due to their diverse magnetic, optical, electronic and catalytic chemistry applications. They commonly find applications in gas sensors, optical devices, UV blockers, polishing materials to name a few. These oxides are typically synthesized under elevated temperatures and/or pressures, carefully monitored oxidizing or reducing environments, hydrothermal conditions, and arc melting. These synthesis techniques may require toxic chemicals and are also energy-intensive.

Fluorite structured cerium oxide (ceria; $CeO_{2-x}$, $0<x\leq0.5$) is a technologically important rare earth metal oxide because of its unique redox properties and high oxygen storage capacity. It has been explored for uses in myriad applications including fuel cells, adsorbents, gas sensors, ultraviolet absorber in sunblocks, catalysts for the oxidation reactions and water gas shift reaction, and antioxidants in biomedicine. Numerous synthetic approaches such as mechanochemical processing, spray pyrolysis, the electrochemical method, the sol-gel method, the solvothermal method, and the surfactant-assisted method have been used for the preparation of nanocrystalline cerium oxide of various shapes and size distributions. These synthetic methodologies often apply either elevated temperatures, pressures, and/or capping agents.

SUMMARY

In general, in one aspect, a room temperature, a facile technique for synthesizing transition metal oxides, transition metal oxynitrates, and/or transition metal oxyhydroxides in the presence of ozone is provided. The oxides can be prepared in water as well as alcohol.

Implementations can include the following feature. Lanthanide (and/or other transition metal) doped cerium oxide nanoparticles can be synthesized in the presence of ozone.

In general, in another aspect, a method for rapid, room temperature synthesis of ceria nanocrystals using ozone is provided.

Implementations can include one or more of the following features. Short chain primary, secondary, and tertiary alcohols can be used as the solvents for the synthesis. The synthetic method can yield ceria nanocrystals of narrow size distribution.

In another general aspect, a method for synthesizing fluorite-structured ceria nanocrystals (NCs) by bubbling a mixture of ozone and oxygen into an ethanolic solution of cerium salts at room temperature is provided.

Implementations can include one or more of the following features. The effect of different anions of the cerium salts on the reaction can be significant for this synthetic method.

In general, in another aspect, a method of producing ceria nanocrystals is provided. The method includes providing a gas that includes ozone to a first solution that includes a cerium salt; and obtaining ceria nanocrystals from the first solution after the gas is provided to the first solution.

Implementations can include one or more of the following features. The gas can include a mixture of oxygen and ozone. The cerium salt can include at least one of cerium (III) nitrate or cerium (III) chloride. The gas can be bubbled into the first solution. The method can include causing the first solution to change from clear to yellow-orange. The method can include generating a first precipitate in the first solution. In some examples, at least a portion of the first precipitate is orange-red. The method can include re-suspending the first precipitate in a second solution. The second solution can include at least one of a primary alcohol, a secondary alcohol, or a tertiary alcohol. The second solution can include at least one of ethanol, methanol, 1-propanol, 2-propanol, or t-butanol. The first solution can include at least one of a primary alcohol, a secondary alcohol, or a tertiary alcohol. The first solution can include at least one of ethanol, methanol, isopropanol, or t-butanol. The method can include applying a centrifugal process to the second solution to produce a second precipitate. In some examples, at least a portion of the second precipitate is at least one of red or orange-red. The method can include drying the second precipitate to produce the ceria nanocrystals. Providing the gas to the first solution and obtaining ceria nanocrystals from the first solution can be performed at room temperature. Providing the gas to the first solution and obtaining ceria nanocrystals from the first solution can be performed at a temperature in a range from 10° C. to 40° C., or in a range from 10° C. to 30° C. At least some of the ceria nanocrystals have dimensions in a range from 2 nm to 6 nm. The ceria nanocrystals can include fluorite-structured cerium oxide. The ceria nanocrystals can be obtained from the first solution after the gas is provided to the first solution for a duration of less than one minute. For example, this method can be enhanced by recycling the ceria nanocrystals through a hydrothermal process to increase the crystallinity of the nanocrystals.

In general, in another aspect, a method of ozone-mediated synthesis of nanoparticles is provided. The method includes providing a gas that includes ozone to a first solution that includes a metal salt that includes at least one of a transition metal or a lanthanide; and producing metal oxide nanoparticles from the first solution after the gas is provided to the first solution. For example, the transition metal or lanthanide can be a metal that has multiple stable oxidation states.

Implementations can include one or more of the following features. The gas can include a mixture of oxygen and ozone. For example, the nanoparticles can be metal oxide nanoparticles. The metal salt can include at least one of manganese (II) acetate, manganese (II) nitrate, ruthenium (III) chloride, cerium (III) nitrate, cerium(III) perchlorate, cerium (III) acetate, or cerium (III) chloride. For example, the nanoparticles can be oxynitrate or oxyhydroxide nanoparticles. The metal salt can include at least one of silver (I) nitrate or cobalt (II) nitrate. The gas can be bubbled into the first solution. The method can include causing the first solution to change from a lighter color to a darker color. The method can include generating a first precipitate in the first solution. The first solution can include at least one of water or ethanol. The method can include applying a centrifugal process to the first solution to produce the first precipitate. The method can include drying the first precipitate to produce the metal oxide nanoparticles. Providing the gas to the first solution and obtaining metal oxide nanoparticles from the first solution can be performed at room temperature. Providing the gas to the first solution and obtaining metal oxide nanoparticles from the first solution can be performed at room temperature in a range from 10° C. to 32.2° C., or in a range from 15.6° C. to 26.7° C., or in a range from 20° C. to 25° C. At least some of the metal oxide nanoparticles can have dimensions in a range from 2 nm to 6 nm. The metal oxide nanoparticles can be obtained from the first solution after the gas is provided to the first solution for a duration of not more than 40 minutes. The metal oxide nanoparticles can be obtained from the first solution after the gas is provided to the first solution for a duration of not more than 30 minutes. The metal oxide nanoparticles can be obtained from the first solution after the gas is provided to the first solution for a duration of not more than 20 minutes. The metal oxide nanoparticles can be obtained from the first solution after the gas is provided to the first solution for a duration of not more than 15 minutes.

In general, in another aspect, a method of ozone mediated synthesis of nanoparticles is provided. The method includes providing a gas that includes ozone to a liquid to produce a solution that includes ozone; dissolving a metal salt in the solution, the metal salt including at least one of a transition metal or a lanthanide; and producing metal oxide nanoparticles from the solution. For example, the transition metal or lanthanide can be a metal that has multiple stable oxidation states.

Implementations can include one or more of the following features. The gas can include a mixture of oxygen and ozone. For example, the nanoparticles can be metal oxide nanoparticles. The metal salt can include at least one of manganese (II) acetate, manganese (II) nitrate, ruthenium (III) chloride, cerium (III) nitrate, cerium (III) perchlorate, cerium (III) chloride, cerium (III) acetate, nickel salt (e.g., nickel chloride or nickel nitrate), vanadium salt (e.g., vanadium nitrate or vanadium chloride), palladium salt (e.g., palladium nitrate), or platinum salt (e.g., platinum nitrate). For example, the nanoparticles can be oxynitrate or oxyhydroxide nanoparticles. The metal salt can include at least one of silver (I) nitrate or cobalt (II) nitrate. The gas can be bubbled into the solution. The solution before ozone treatment can have a lighter color and the solution after ozone treatment has a darker color. The method can include generating a first precipitate in the solution. The solution can include at least one of water or ethanol. The method can include applying a centrifugal process to the solution after ozone treatment to produce the first precipitate. The method can include drying the first precipitate to produce the metal oxide nanoparticles. Providing the gas to the solution and obtaining metal oxide nanoparticles from the solution can be performed at room temperature. Providing the gas to the solution and obtaining metal oxide nanoparticles from the solution can be performed at a temperature in a range from 10° C. to 32.2° C., or in a range from 15.6° C. to 36.7° C., or in a range from 20° C. to 25° C. At least some of the metal oxide nanoparticles have dimensions in a range from 2 nm to 10 nm. The solution can be obtained after the gas is provided to the liquid for a duration of not more than 40 minutes, or not more than 30 minutes, or not more than 20 minutes, or not more than 15 minutes.

In general, in another aspect, a method of producing lanthanide doped cerium oxide nanoparticles is provided. The method includes dissolving a cerium nitrate in a first liquid to produce a first solution; dissolving a lanthanide nitrate in a second liquid to produce a second solution; mixing the first solution and the second solution to produce a third solution; providing a gas that includes ozone to the third solution; and producing lanthanide doped cerium oxide nanoparticles from the third solution after ozone treatment.

Implementations can include one or more of the following features. The lanthanide nitrate can include at least one of gadolinium nitrate, lanthanum nitrate, yttrium nitrate, praseodymium nitrate, or erbium nitrate. The first liquid can include ethanol. The second liquid can include ethanol. The gas can include a mixture of oxygen and ozone. The gas can be bubbled into the third solution. The first and second solutions can have lighter colors and the third solution can have a darker color. The method can include generating a first precipitate in the third solution. The method can include applying a centrifugal process to the third solution to produce the first precipitate. The method can include drying the first precipitate to produce the lanthanide doped cerium oxide nanoparticles. Providing the gas to the third solution and obtaining lanthanide doped cerium oxide nanoparticles from the third solution can be performed at room temperature. Providing the gas to the third solution and obtaining lanthanide doped cerium oxide nanoparticles from the third solution can be performed at a temperature in a range from 10° C. to 32.2° C., or in a range from 15.6° C. to 36.7° C., or in a range from 20° C. to 25° C. At least some of the lanthanide doped cerium oxide nanoparticles have dimensions in a range from 2 nm to 5 nm. The lanthanide doped cerium oxide nanoparticles can be obtained from the third solution after the gas is provided to the third solution for a duration of not more than 40 minutes. The lanthanide doped cerium oxide nanoparticles can be obtained from the third solution after the gas is provided to the third solution for a duration of not more than 30 minutes.

In general, in another aspect, a method of producing oxide nanoparticles is provided. The method includes providing a gas that includes ozone to a first solution that includes a precursor material; and producing oxide nanoparticles from the first solution after the gas is provided to the first solution. For example, the precursor material can include an alkoxy precursor.

Implementations can include one or more of the following features. The gas can include a mixture of oxygen and ozone. The precursor material can include tetraethoxysilane (TEOS). The oxide nanoparticles can include silicon oxide nanoparticles. The silicon oxide nanoparticles can have dimensions in a range from about 1 nm to about 2 nm.

The details of one or more embodiments of the subject matter of this specification are set forth in the accompanying drawings and the description below. Other features, aspects, and advantages of the subject matter will become apparent from the description, the drawings, and the claims.

DESCRIPTION OF DRAWINGS

FIG. 5A is a photo of aqueous ruthenium (III) chloride solution after ozone treatment. FIG. 5B is an image of ruthenium oxide nanoparticles produced from the aqueous ruthenium (III) chloride solution after ozone treatment. The image was obtained using transmission electron microscopy.

FIG. 14 is a photo of samples of dry, as-synthesized ceria nanocrystals.

FIG. 15 is a HRTEM image of the as-synthesized ceria nanocrystals obtained after ozonating an ethanol solution of cerium (III) nitrate hexahydrate for 15 seconds. The circle shows one ceria nanocrystal.

FIG. 16 shows the SAED pattern of ceria nanoparticles shown in FIG. 15.

FIGS. 17A, 17B, and 17C show HRTEM of ceria nanoparticles conducted at different time points (15 seconds, 5 minutes, and 1 hour, respectively). The scale bar on the images is 5 nm. HRTEM analysis revealed that the sizes of the nanocrystals remained around 2-5 nm even on changing the ozonation time (i.e., 15 seconds, 5 minutes, and 1 hour). Individual nanocrystals are circled for clarity.

FIGS. 17D, 17E, and 17F show SAED analysis of ceria nanoparticles conducted at different time points (15 seconds, 5 minutes, and 1 hour, respectively). The scale bar on the images is 2 1/nm. SAED analysis showed the products as fluorite structured cerium oxide.

FIG. 18 is a graph showing representative EDS spectrum of ceria nanoparticles. The EDS spectrum shows the presence of C, O, Ce and Cu. The Cu and C signal is from the carbon film coated copper (Cu) TEM grid.

FIG. 19 is a graph showing the Raman spectrum of ceria nanoparticles. The mode near 450 $cm^{-1}$ represents the first order Raman active $F_{2g}$ mode of fluorite structured ceria. The mode near 600 $cm^{-1}$ can be attributed to oxygen vacancy defects present in the ceria nanoparticles.

FIG. 20 is a graph showing the diffuse reflectance spectrum of ceria nanoparticles. The nanoparticles were synthesized by bubbling ozone in the ethanolic solution of cerium nitrate for 30 minutes. The change of reflectance above 540 nm indicates that the nanoparticles are red in color.

FIG. 21 is an atomic force microscopy image of birnessite ($M_xMnO_2 \cdot nH_2O$ ($M=H^+$)) nanoparticles and aggregates made by ozonating an manganese salt solution.

FIG. 22 is an atomic force microscopy image of silicon oxide nanoparticles and aggregates made by ozonating an ethanol solution of tetraethoxysilane (TEOS).

FIG. 23 is an atomic force microscopy image of ruthenium oxide nanoparticles and aggregates made by ozonating an aqueous solution of ruthenium chloride.

DETAILED DESCRIPTION

This disclosure relates to room temperature synthesis of metal oxides, metal oxynitrates, and metal oxyhydroxides using ozone. The synthesis of transition metal oxides, metal oxynitrates, and metal oxyhydroxides using ozone can be carried out in at least two ways. In some implementations, metal salts are dissolved using water or ethanol, then treated with ozone. Treating with ozone can be achieved by, e.g., passing the ozone (e.g., bubbling ozone gas) through the solution so that the dissolved metal salts can react with ozone. In some implementations, water or ethanol are treated with ozone, then the metal salts are dissolved in the ozone-treated water or ethanol. Treating with ozone can be achieved by passing the ozone (e.g., bubbling ozone gas) through the water or ethanol.

In some implementations, transition metal oxides and lanthanide oxides (inner transition metal oxide) are synthesized by subjecting an aqueous solution of metal salts to ozone treatment. The following describes an exemplary process for producing a metal oxide using ozone. A metal salt is dissolved in deionized water. The salt solution is bubbled, for several minutes, with a stream of ozone generated by passing dry oxygen through an ozone generator. The color of the solution may change upon ozone treatment. The obtained mixture is centrifuged for several minutes. The product obtained is washed with deionized water (or ethanol if synthesized in ethanol) and centrifuged for several minutes. The product is air dried, producing nano-sized crystals, particles, or structures of the metal oxide.

For example, ceria nanocrystals can be synthesized in two ways. In a first method, cerium salt is dissolved in alcohol, and ozone gas (or ozone and oxygen gas mixture) is passed through the solution. After a period of time, orange-red precipitate includes ceria nanocrystals is produced. In a second method, ozone (or ozone and oxygen gas mixture) is bubbled through ethanol for a period of time. Afterwards, cerium salt is added to the solution, and the salt is thoroughly dissolved by, e.g., shaking. The solution is centrifuged, and after centrifugation, orange-red precipitation that includes ceria nanocrystals is produced. The precipitate obtained by the first or the second method can be further centrifuged to settle the precipitate. The supernatant ethanol is removed. A fresh batch of ethanol can be added and the centrifuging process is repeated. The solid pellet settled can be vacuum dried.

Figure 24:
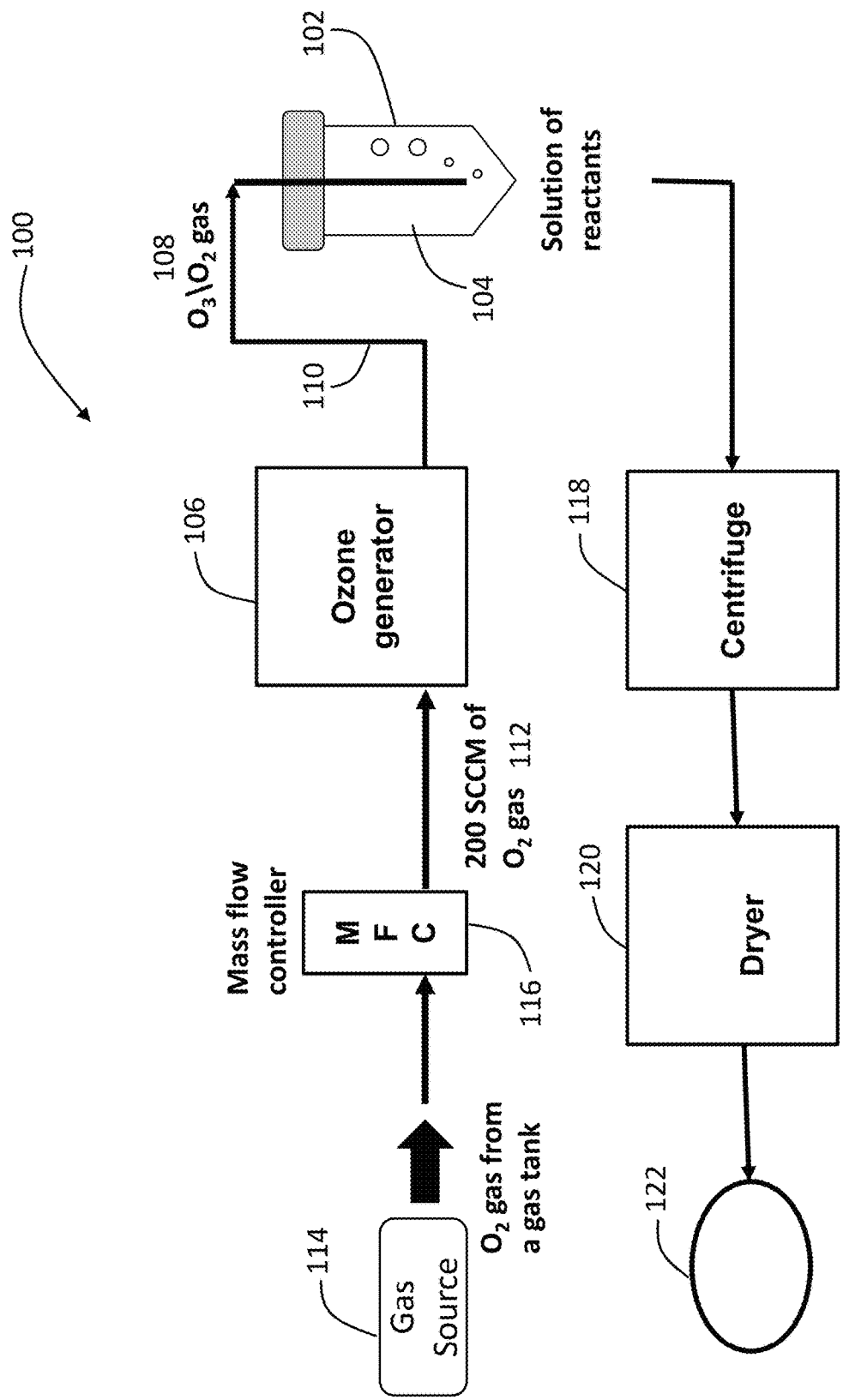
FIG. 24 is an example system for generating nanoparticles.

Referring to FIG. 24, an example system 100 for generating nanoparticles with the assistance of ozone includes a container 102 configured to contain a solution 104 that includes dissolved metal salt, an ozone generator 106 for generating ozone gas 108, and a pipe 110 for transporting the ozone gas 108 from the ozone generator 106 to the solution 104. The ozone generator 106 can be configured to receive oxygen gas 112 and generate the ozone gas 108 from the oxygen gas 112. An oxygen gas source 114 is configured to provide the oxygen gas. The system 100 includes a mass flow controller 116 configured to control the flow of oxygen to the ozone generator 106.

The system 100 can generate nanoparticles in two ways. In a first method, metal salt is dissolved in the solution 104, and ozone gas 108 (or ozone and oxygen gas mixture) is passed (e.g., bubbled) through the solution 104. After a period of time, a precipitate that includes nanocrystals is produced in the solution 104. In a second method, ozone 108 (or ozone and oxygen gas mixture) is passed (e.g., bubbled) through the solution 104 for a period of time. Afterwards, metal salt is added to the solution 104, and the metal salt is thoroughly dissolved by, e.g., shaking. The solution 104 is then centrifuged using a centrifuge 118, and after centrifugation, a precipitation that includes nanocrystals is produced. In the first or second method, the supernatant solution can be removed from the container 102, and fresh solution can be added to the container 102 to dissolve the precipitate, and the centrifuging process is repeated, resulting in a second precipitate that has a higher concentration of the nanocrystals. The second precipitate can be vacuum dried to produce a pellet that includes the nanocrystals. Afterwards, the pellet can be dissolved in a solution and be used to, e.g., form a coating on the surface of a device in which the coating includes the nanocrystals.

The solution 104 can include metal salt, and passing ozone gas into the solution 104 for a period of time can result in, depending on the type of metal salt in the solution, metal oxide, metal oxynitrate, and/or metal oxyhydroxide nanoparticles being formed in the solution. The solution 104 can include, e.g., water, a primary alcohol, a secondary alcohol, and/or a tertiary alcohol. The solution 104 can include, e.g., ethanol, methanol, 1-propanol, 2-propanol, and/or t-butanol.

In some implementations, the metal salt is dissolved in the solution 104, and the ozone generator 106 provides the gas 108 that includes ozone to the solution 104. The metal salt includes, e.g., cerium salt, such as cerium (III) nitrate or cerium (III) chloride, and ceria nanocrystals are produced in the solution 104 after the gas 108 is provided to the solution 104. The solution 104 can be maintained at a temperature in a range from 10° C. to 30° C. during formation of the ceria nanocrystals. The ceria nanocrystals can include fluorite structured cerium oxide. The ceria nanocrystals can have dimensions in a range from 2 nm to 6 nm.

In some implementations, the metal salt is dissolved in the solution 104, and the ozone generator 106 provides the gas 108 that includes ozone to the solution 104. The metal salt includes, e.g., a transition metal or a lanthanide, such as manganese (II) acetate, manganese (II) nitrate, silver (I) nitrate, cobalt (II) nitrate, ruthenium (III) chloride, cerium (III) nitrate, cerium (III) perchlorate, cerium (III) acetate, or cerium (III) chloride. Metal oxide nanoparticles, metal oxynitrate nanoparticles, or metal oxyhydroxide nanoparticles are produced in the solution 104 after the gas 108 is provided to the solution 104. The solution 104 can be maintained at a temperature in a range from 10° C. to 30° C. during formation of the nanoparticles. The nanoparticles can have dimensions in a range from 2 nm to 6 nm.

In some implementations, the ozone generator 106 provides the gas 108 that includes ozone to a liquid to produce the solution 104 that includes ozone. The metal salt is dissolved in the solution, in which the metal salt include a transition metal or a lanthanide, such as manganese (II) acetate, manganese (II) nitrate, silver (I) nitrate, cobalt (II) nitrate, ruthenium (III) chloride, cerium (III) nitrate, cerium (III) perchlorate, cerium (III) chloride, cerium (III) acetate, nickel salt, vanadium salt, palladium salt, or platinum salt. Metal oxide nanoparticles, metal oxynitrate nanoparticles, or metal oxyhydroxide nanoparticles are produced in the solution 104. The nickel salt includes, e.g., nickel chloride or nickel nitrate. The vanadium salt includes, e.g., vanadium nitrate or vanadium chloride. The palladium salt includes, e.g., palladium nitrate. The platinum salt includes, e.g., platinum nitrate. The solution 104 can be maintained at a temperature in a range from 10° C. to 30° C. during formation of the nanoparticles. The nanoparticles can have dimensions in a range from 2 nm to 5 nm.

In some implementations, cerium nitrate is dissolved in a first liquid to produce a first solution, lanthanide nitrate is dissolved in a second liquid to produce a second solution, and the first solution and the second solution are mixed to produce the solution 104. The ozone generator 106 provides the gas 108 that includes ozone to the solution 104, and lanthanide doped cerium oxide nanoparticles are produced in the solution 104. The first liquid includes, e.g., ethanol, and the second liquid includes, e.g., ethanol. The lanthanide nitrate includes, e.g., gadolinium nitrate, lanthanum nitrate, yttrium nitrate, praseodymium nitrate, or erbium nitrate. The solution 104 can be maintained at a temperature in a range from 10° C. to 30° C. during formation of the nanocrystals. The nanoparticles can have dimensions in a range from 2 nm to 5 nm In some implementations, the ozone generator 106 provides the gas 108 that includes ozone to a solution 104 that includes a precursor material, and oxide nanoparticles are produced in the solution 104 after the gas 108 is provided to the solution 104. The precursor material includes, e.g., tetraethoxysilane (TEOS). The oxide nanoparticles include, e.g., silicon oxide nanoparticles. The nanoparticles can have dimensions in a range from 1 nm to 2 nm The following describes experiments for synthesizing transition metal oxides and lanthanide oxides (inner transition metal oxide) by subjecting an aqueous solution of metal salts to ozone treatment. In the experiments, 0.3 g of the metal salt was dissolved in 15 mL deionized water. The salt solution was bubbled for 15 min with a stream of ozone (0.5 g/h) generated by passing 200 SCCM of extra dry 99.6% oxygen (Matheson Tri-Gas, Lincoln, Nebr.) through an ozone generator (MP-3000, A2Z Ozone, Louisville Ky.). The color of the solution underwent transformation on ozone treatment. The obtained mixture was centrifuged at 4500 RPM for 15 minutes. The product obtained was washed with deionized water (or ethanol if synthesized in ethanol) and centrifuged again at 4500 RPM for 15 minutes. The product was finally air dried overnight. Similar experiments were also performed using ethanol as the solvent. The colors of the transition metal salts solutions explored for this room temperature process before and after ozone treatment are shown in FIGS. 1A, 1B, 2A, 2B, 3A, 3B, 4A, 4B, 6A, 6B, 9A, 9B, 10A, 10B, 11A, 11B, 11C, 12A, and 12B. The morphology of the as-prepared nanoparticles was examined by transmission electron microscopy (TEM) using a Hitachi H7500 TEM operated at 80 kV. The crystal structure of as-synthesized nanoparticles was examined using a Rigaku D/max B diffractometer. The X-ray source was operated at 40 kV and 30 mA current to generate Co Kα X-ray with an average wavelength of 1.7903 Å.

The conditions for performing the experiments described above are examples only, the metal oxides can be synthesized under different conditions. For example, the relative amount of metal salt and deionized water, the time for ozone treatment, the concentration of ozone used to treat the metal salt solution, the dryness of the oxygen used to generate the ozone, the type of ozone generator used to produce the ozone, the rotational speed and time duration of centrifugal treatment, and the method of drying the synthesized product, can be different from those described above.

Figure 1A:
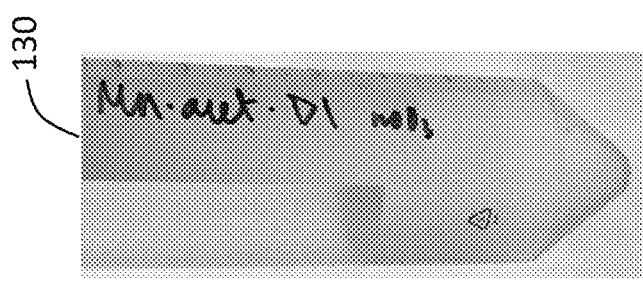
FIGS. 1A and 1B are photos of aqueous manganese (II) acetate solution before and after ozone treatment.
Figure 1B:
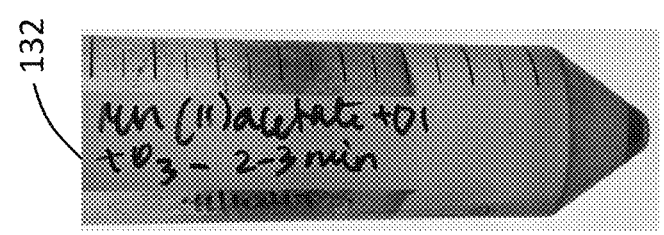
Figure 1C:
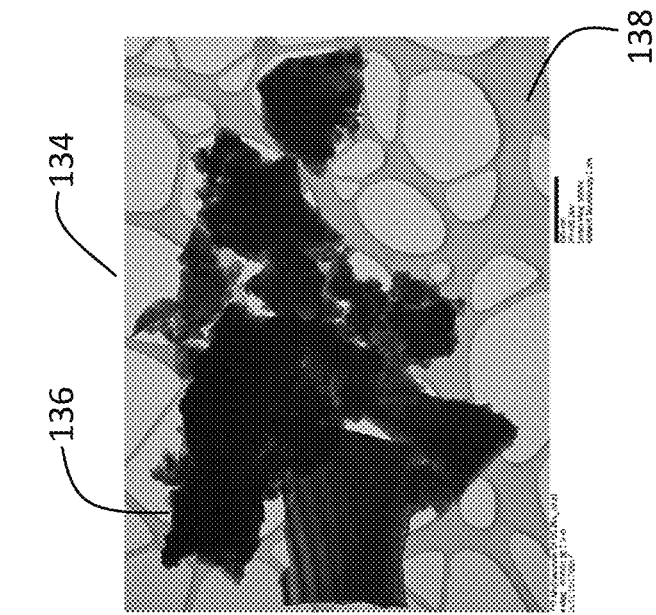
FIG. 1C is an image of microstructures composed of birnessite ($M_xMnO_2 \cdot nH_2O$ ($M=H^+$)) nanoparticles produced from the aqueous manganese (II) acetate solution after ozone treatment. The image was obtained using transmission electron microscopy (TEM).

The following describes results of the experiments that were performed using deionized water as solvent for dissolving the metal salts. FIG. 1A is a photo 130 of aqueous manganese (II) acetate solution before ozone treatment. FIG. 1B is a photo 132 of the aqueous manganese (II) acetate solution after ozone treatment. The solution was subjected to ozone treatment for 3 minutes. The photos 130, 132 show that the color of the aqueous manganese (II) acetate solution became darker after ozone treatment. FIG. 1C is an image 134 of microstructures 136 composed of birnessite ($M_xMnO_2 \cdot nH_2O$ (M=$H^+$)) nanoparticles obtained from the solution shown in FIG. 1B. The nanoparticles 136 were deposited on a lacey amorphous carbon film 138. The image 134 was obtained using transmission electron microscopy (TEM).

Figure 2C:
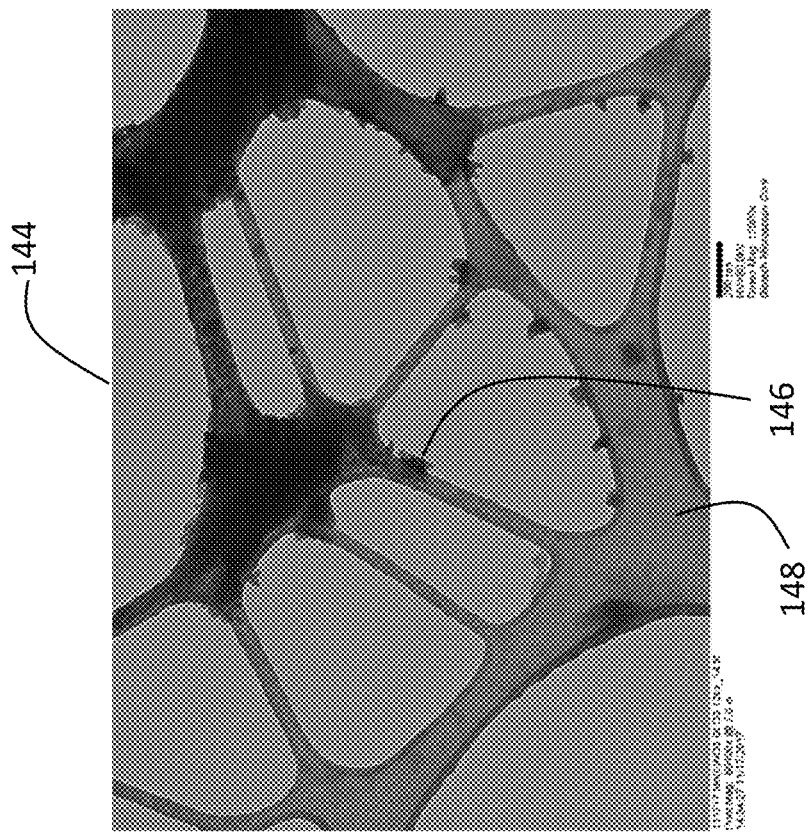
FIG. 2C is an image of birnessite ($M_xMnO_2 \cdot nH_2O$ ($M=H^+$)) nanoparticles produced from the aqueous manganese (II) nitrate solution after ozone treatment. The image was obtained using transmission electron microscopy.
Figure 2B:
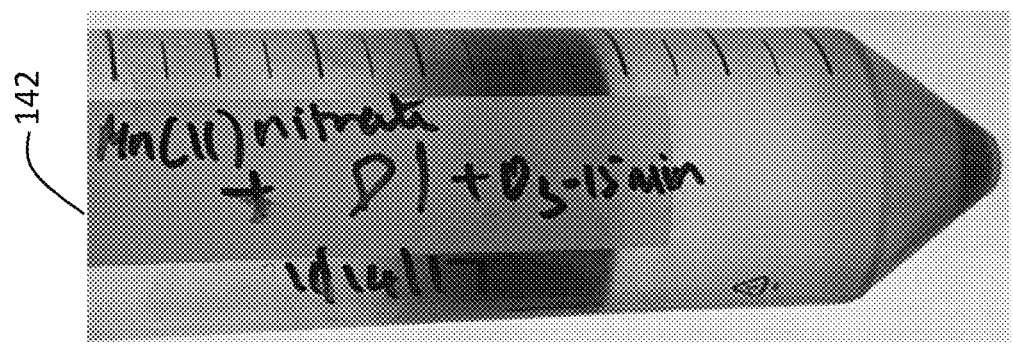
FIGS. 2A and 2B are photos of aqueous manganese (II) nitrate solution before and after, respectively, ozone treatment.
Figure 2A:
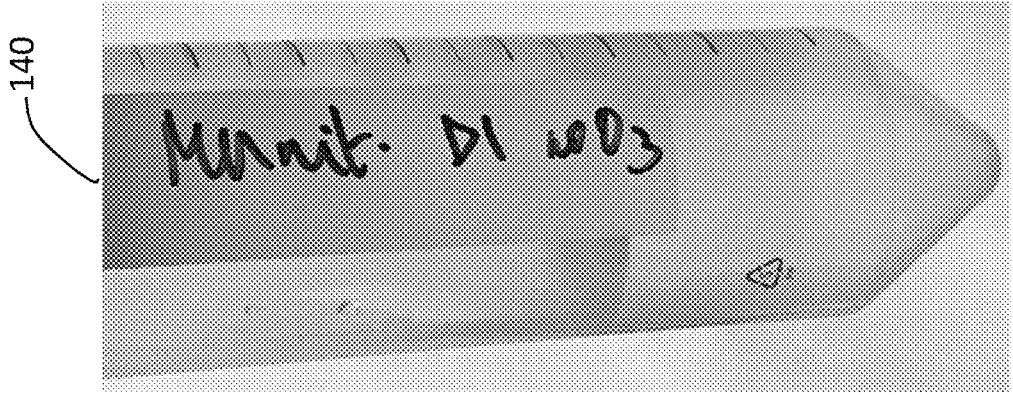

FIG. 2A is a photo 140 of aqueous manganese (II) nitrate solution before ozone treatment. FIG. 2B is a photo 142 of the aqueous manganese (II) nitrate solution after 15 minutes of ozone treatment. The photos 140, 142 show that the color of the aqueous manganese (II) nitrate solution became darker after ozone treatment. FIG. 2C is an image 144 of birnessite ($M_xMnO_2 \cdot nH_2O$ (M=$H^+$)) nanoparticles 146 obtained from the solution shown in FIG. 2B. The nanoparticles 146 were deposited on a lacey amorphous carbon film 148. The image 144 was obtained using transmission electron microscopy.

Figure 3C:
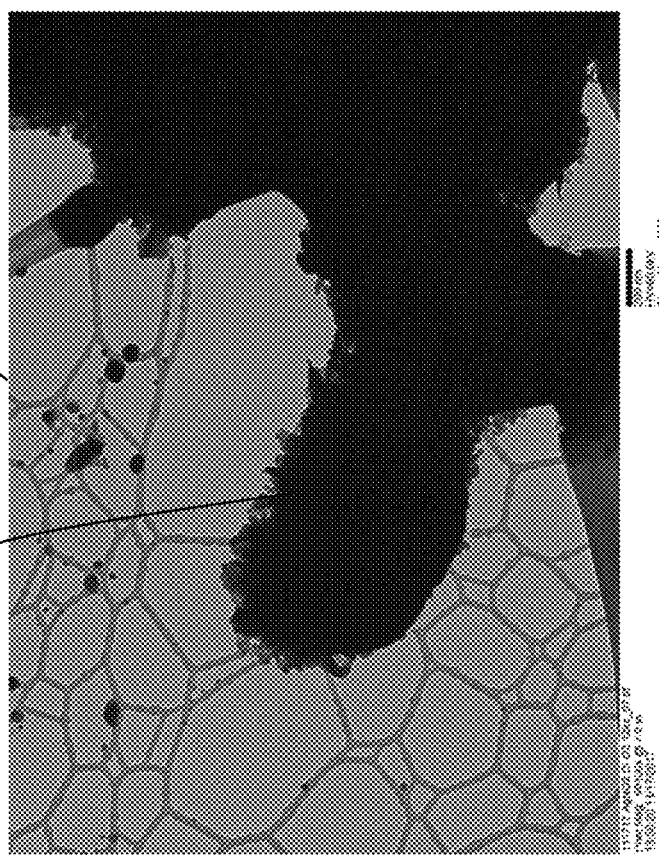
FIG. 3C is an image of silver oxynitrate nanoparticles produced from the aqueous silver (I) nitrate solution after ozone treatment. The image was obtained using transmission electron microscopy.
Figure 3B:
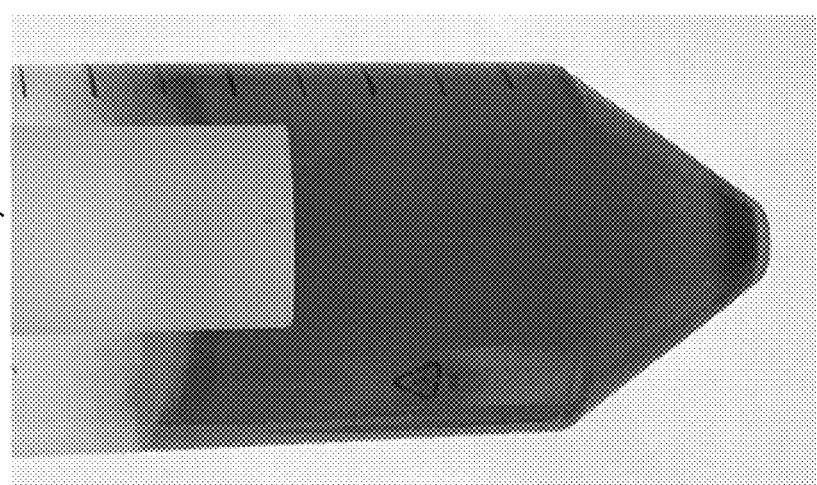
FIGS. 3A and 3B are photos of aqueous silver (I) nitrate solution before and after, respectively, ozone treatment.
Figure 3A:
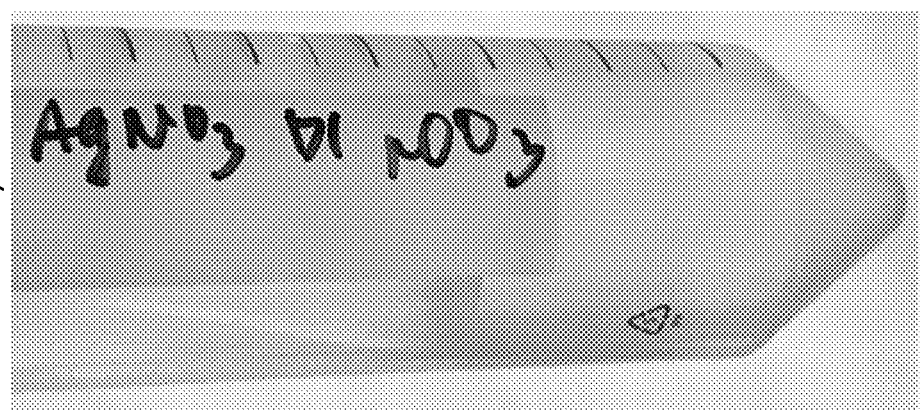

FIG. 3A is a photo 150 of aqueous silver (I) nitrate solution before ozone treatment. FIG. 3B is a photo 152 of the aqueous silver (I) nitrate solution after 15 minutes of ozone treatment. The photos 150, 152 show that the color of the aqueous silver (I) nitrate solution became darker after ozone treatment. FIG. 3C is an image 154 of silver oxynitrate nanoparticles 156 obtained from the solution shown in FIG. 3B. The image 154 was obtained using transmission electron microscopy.

Figure 4C:
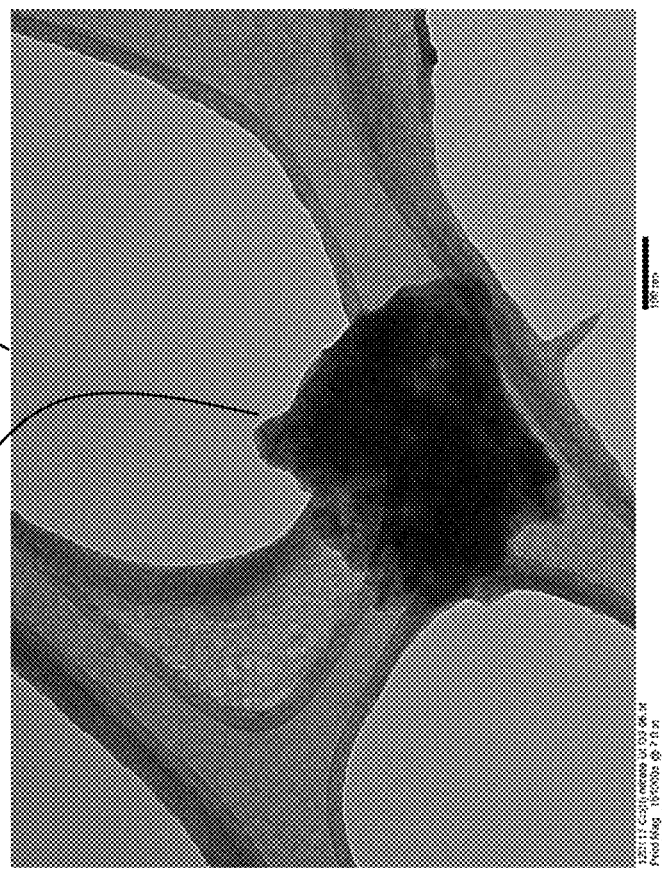
FIG. 4C is an image of aggregates of cobalt oxyhydroxide nanoparticles produced from the aqueous cobalt (II) nitrate solution after ozone treatment. The image was obtained using transmission electron microscopy.
Figure 4B:
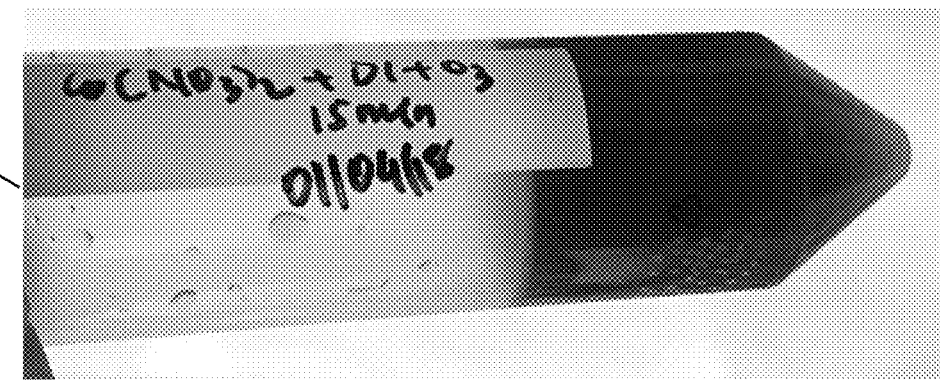
FIGS. 4A and 4B are photos of aqueous cobalt (II) nitrate solution before and after, respectively, ozone treatment.
Figure 4A:
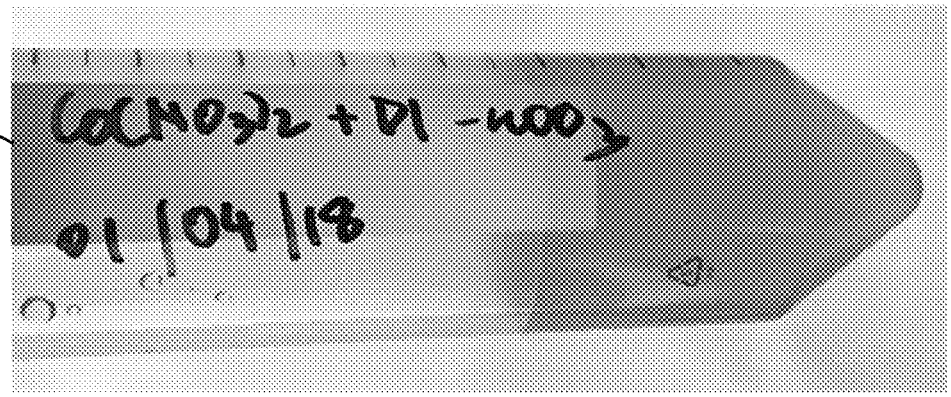

FIG. 4A is a photo 160 of aqueous cobalt (II) nitrate solution before ozone treatment. FIG. 4B is a photo 162 of the aqueous cobalt (II) nitrate solution after 15 minutes of ozone treatment. The solution was allowed to sit for a day post ozonation. FIG. 4C is an image 164 of aggregates of cobalt oxyhydroxide nanoparticles 166 obtained from the solution shown in FIG. 4B. The image 164 was obtained using transmission electron microscopy.

FIG. 5A is a photo 170 of aqueous ruthenium (III) chloride solution after 15 minutes of ozone treatment. The color of the solution before ozone treatment is similar to that after ozonation. FIG. 5B is an image 172 of ruthenium oxide nanoparticles 174 obtained from the solution shown in FIG. 5A. The image 172 was obtained using transmission electron microscopy.

Figure 6C:
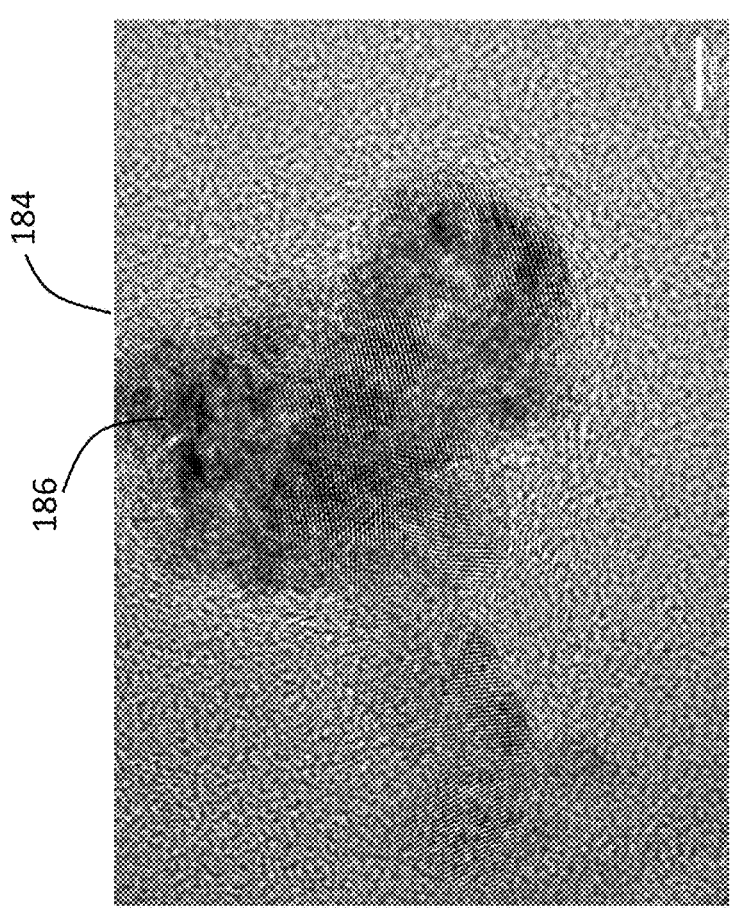
FIG. 6C is an image of cerium oxide ($CeO_{2-x}$, $0<x\leq0.5$) nanoparticles produced from the aqueous cerium (III) nitrate solution after ozone treatment. The image was obtained using transmission electron microscopy.
Figure 6B:
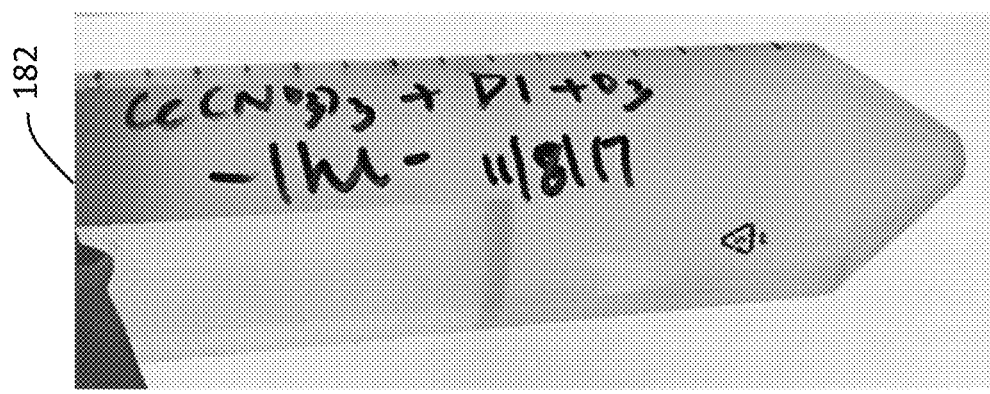
FIGS. 6A and 6B are photos of aqueous cerium (III) nitrate solution before and after, respectively, of ozone treatment.
Figure 6A:
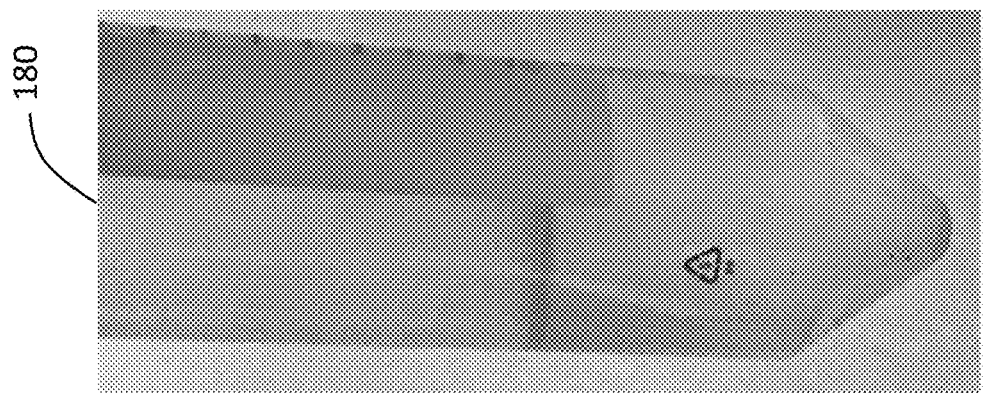

FIG. 6A is a photo 180 of aqueous cerium (III) nitrate solution before ozone treatment. FIG. 6B is a photo 182 of the aqueous cerium (III) nitrate solution after 15 minutes of ozone treatment. FIG. 6C is an image 184 of cerium (IV) oxide ($CeO2-x$, $0<x \leq 0.5$) nanoparticles 186 obtained from the solution shown in FIG. 6B. The image 184 was obtained using transmission electron microscopy.

Figure 7:
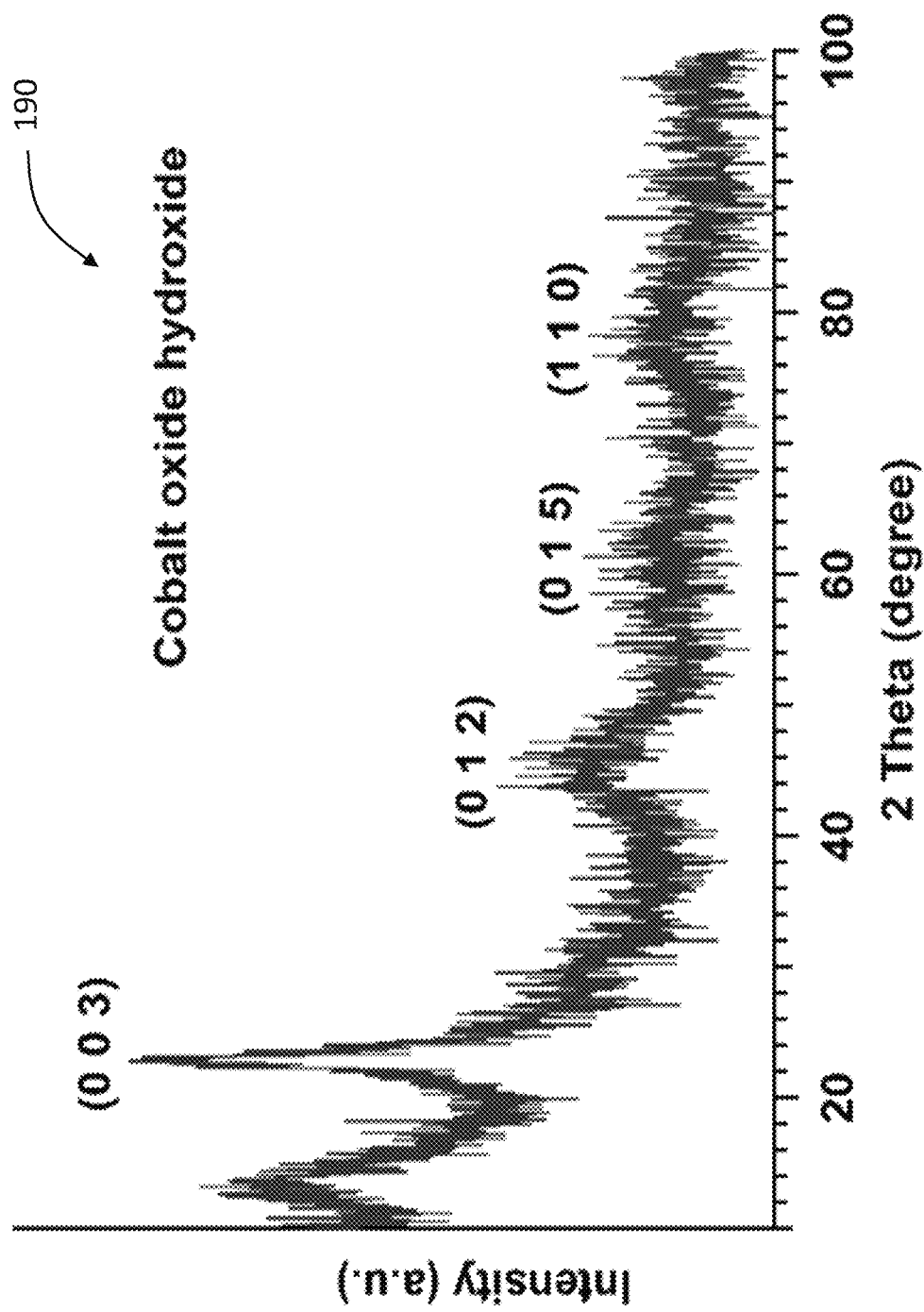
FIG. 7 is a graph showing the XRD pattern of the synthesized material obtained after dissolving cobalt nitrate in water and applying ozone treatment.

The following describes characteristics of some of the metal oxides that were obtained using ozone treatment described above. Referring to FIG. 7, a graph 190 shows the X-ray diffraction (XRD) patterns of the cobalt oxide nanoparticles shown in FIG. 4C.

Figure 8:
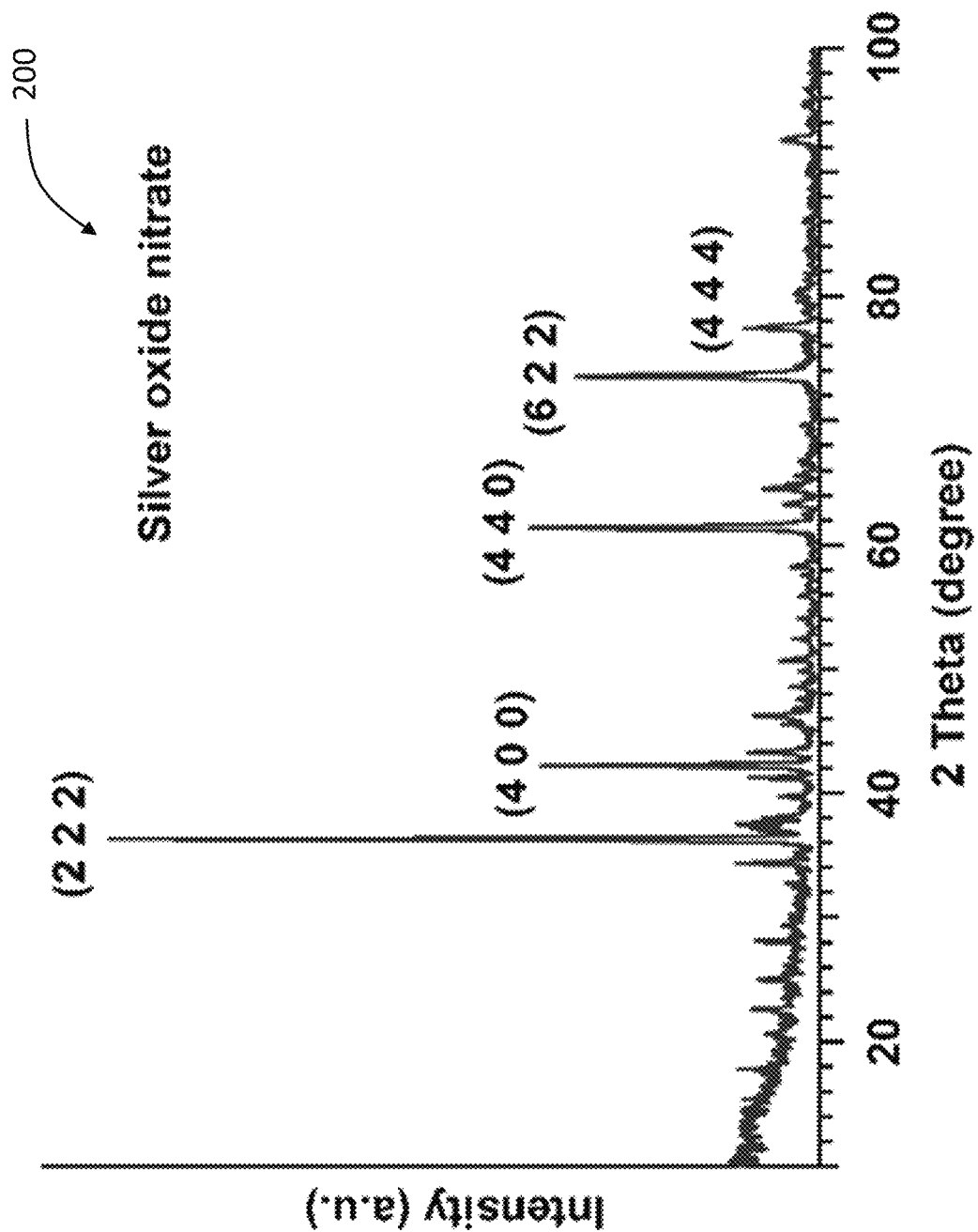
FIG. 8 is a graph showing the XRD pattern of the synthesized material obtained after dissolving silver nitrate in water and applying ozone treatment.

FIG. 8 is a graph 200 showing the X-ray diffraction patterns of the silver oxynitrate nanoparticles shown in FIG. 3C.

The following describe results of experiments that were performed for synthesizing metal oxides using ethanol as solvent for dissolving the metal salts. Examples of some salts are provided below. Some solutions of salts, such as silver nitrate and cobalt nitrate, did not show a visible change in color post ozone treatment. However, the TEM analysis indicated the presence of nano-sized structures.

Figure 9C:
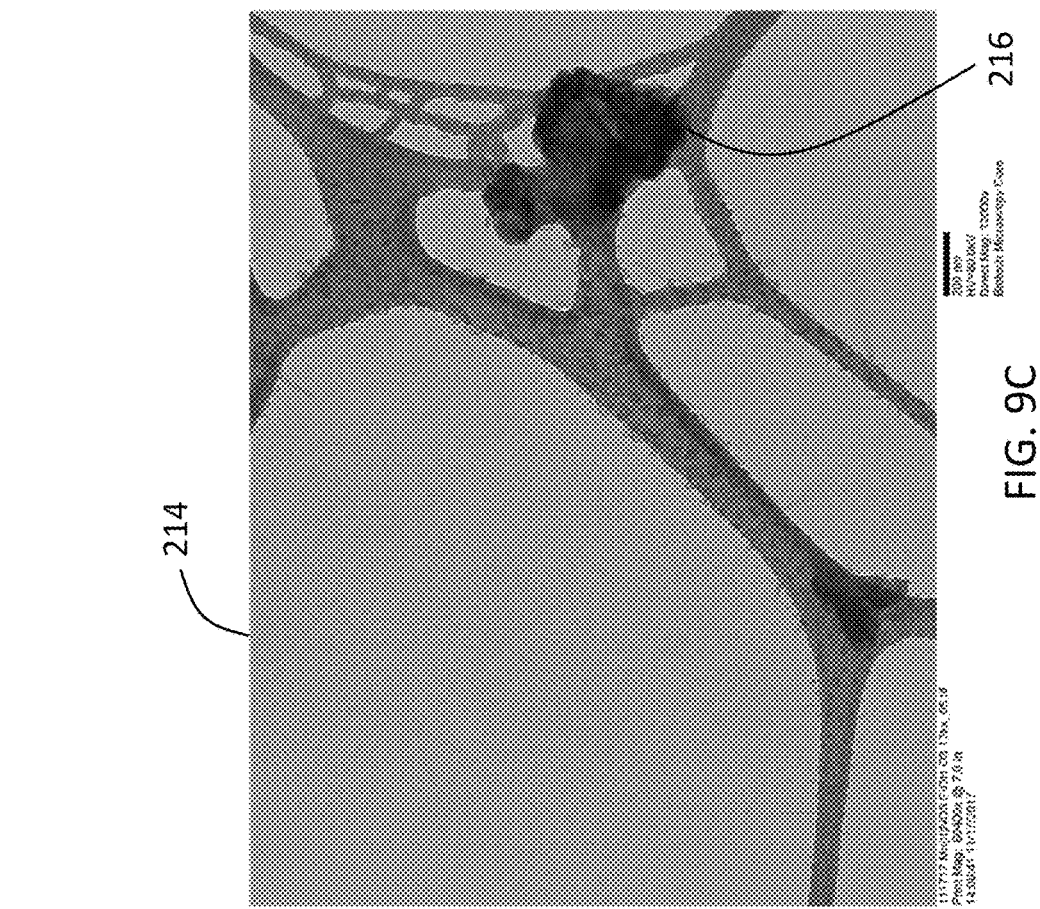
FIG. 9C is an image of birnessite ($M_xMnO_2 \cdot nH_2O$ ($M=H^+$)) nanoparticles produced from the ethanolic manganese (II) acetate solution after ozone treatment. The image was obtained using transmission electron microscopy.
Figure 9B:
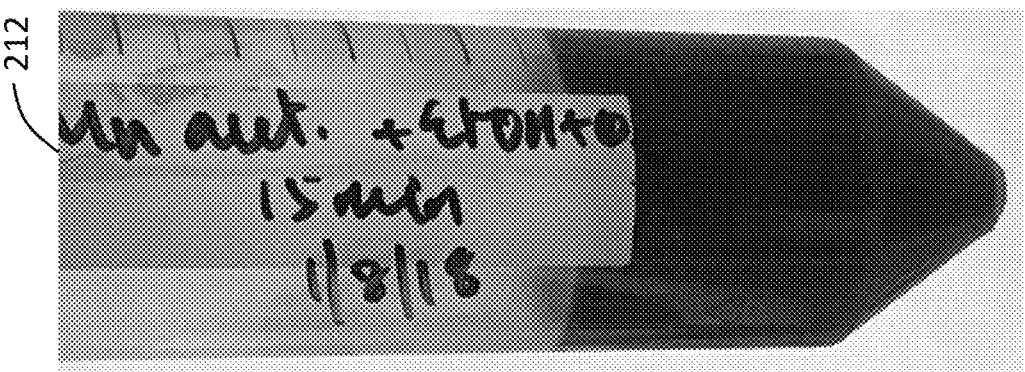
FIGS. 9A and 9B are photos of ethanolic manganese (II) acetate solution before and after, respectively, ozone treatment.
Figure 9A:
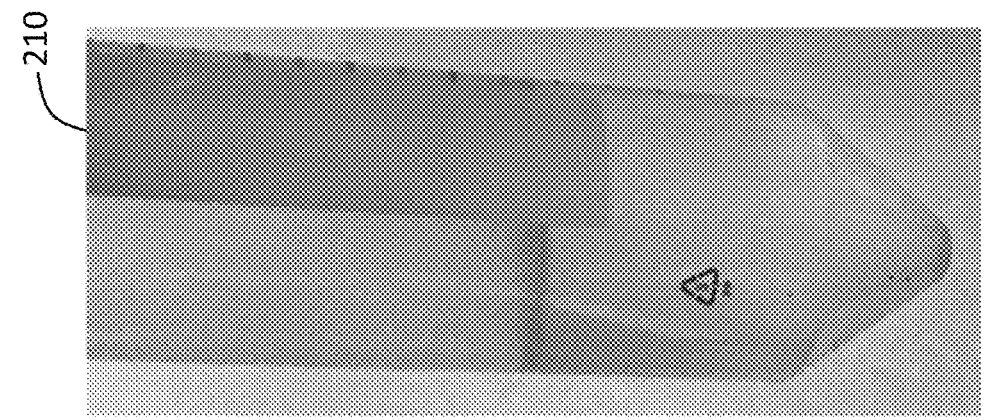

FIG. 9A is a photo 210 of ethanolic manganese (II) acetate solution before ozone treatment. FIG. 9B is a photo 212 of the ethanolic manganese (II) acetate solution after ozone treatment. The solution was subjected to ozone treatment for 15 minutes. The photos 210, 212 show that the color of the ethanolic manganese (II) acetate solution became darker after ozone treatment. FIG. 9C is an image 214 of birnessite ($M_xMnO_2 \cdot nH_2O$ ($M=H^+$)) nanoparticles 216 obtained from the solution shown in FIG. 9B. Birnessite ($M_xMnO_2 \cdot nH_2O$ ($M=H^+$)) nanoparticles 216 having dimensions ranging from less than about 1 nm to about 3 nm were synthesized. The image 214 was obtained using transmission electron microscopy.

Figure 10B:
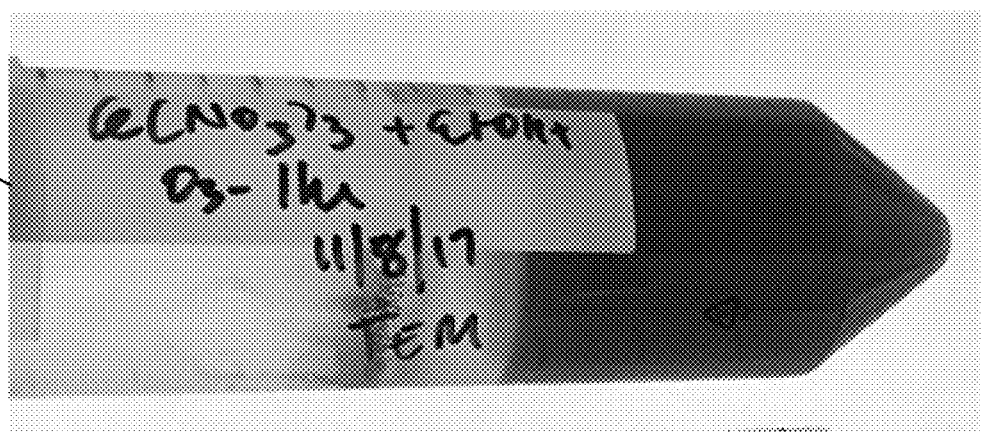
FIGS. 10A and 10B are photos of ethanolic cerium (II) nitrate solution before and after, respectively, ozone treatment.
Figure 10A:
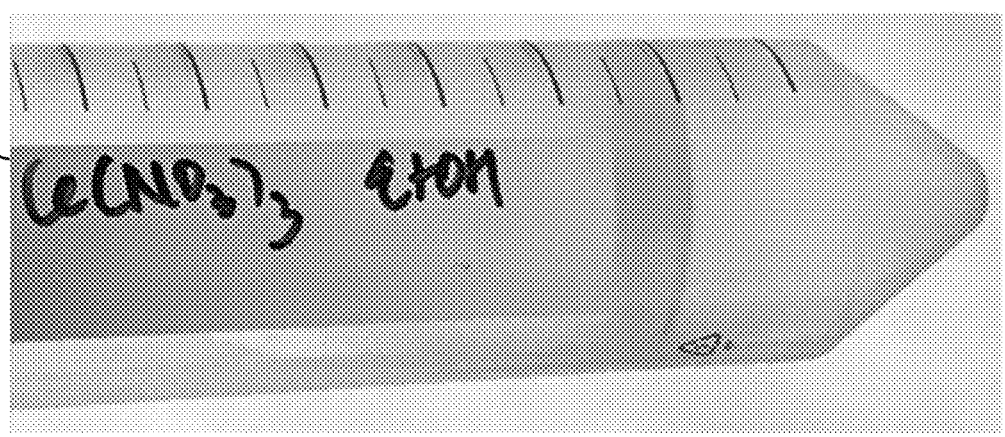

FIG. 10A is a photo 220 of ethanolic cerium (III) nitrate solution before ozone treatment. FIG. 10B is a photo 222 of the ethanolic cerium (III) nitrate solution after 15 minutes of ozone treatment. The photos 210, 212 show that the color of the ethanolic cerium (III) nitrate solution became darker after ozone treatment.

The following describe results of experiments that were performed for synthesizing metal oxide nanoparticles by subjecting deionized water or ethanol to a stream of ozone (0.5 g/h) generated by passing 200 SCCM of extra dry 99.6% oxygen (Matheson Tri-Gas, Lincoln, Nebr.) through an ozone generator (MP-3000, A2Z Ozone, Louisville Ky.) for about 15 minutes. After bubbling ozone in the solvent, 0.3 g of various metal salts (e.g., manganese (II) acetate, manganese (II) nitrate, silver (I) nitrate, cobalt (II) nitrate, ruthenium (III) chloride, and cerium (III) nitrate) were dissolved in the solution by shaking. A change in the solution color was observed. The solution was then centrifuged at 4500 RPM for 15 minutes to settle the nanoparticles in the solution. The product was washed with deionized water (or ethanol if prepared in ethanol) and centrifuged again at 4500 RPM for 15 minutes. The product was finally air dried overnight. The conditions for performing the experiments described above are examples only, the metal oxides can also be synthesized under different conditions.

Figure 11:
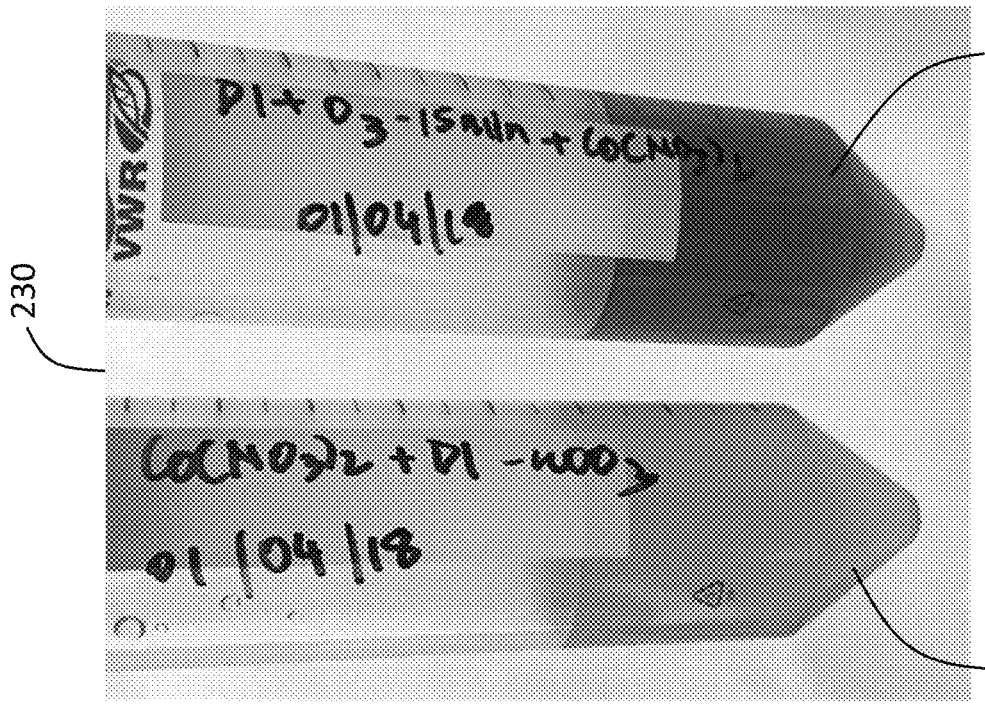
FIG. 11 shows a photo of cobalt (II) nitrate $Co(NO_3)_2$ in de-ionized water in which the water was not subject to ozone treatment, and cobalt (II) nitrate dissolved in de-ionized water, in which the de-ionized water was subject to ozone treatment.

Referring to FIG. 11, on the left of a photo 230 shows a solution 232 in which cobalt (II) nitrate $Co(NO_3)_2$ is dissolved in de-ionized water in which the water was not subject to ozone treatment. On the right of the photo 230 shows a solution 234 in which cobalt (II) nitrate is dissolved in de-ionized water, and the de-ionized water was subject to 15 minutes of ozone treatment. The photo 230 shows that the color of the cobalt (II) nitrate solution 234 in which the cobalt (II) nitrate was dissolved in ozone-treated de-ionized water has a darker color.

Figure 12B:
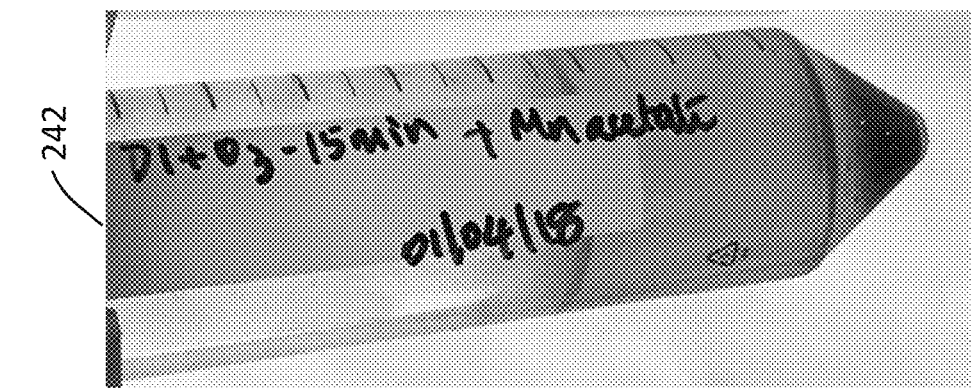
FIG. 12B is a photo of manganese (II) acetate dissolved in de-ionized water, in which the de-ionized water was subject to ozone treatment.
Figure 12A:
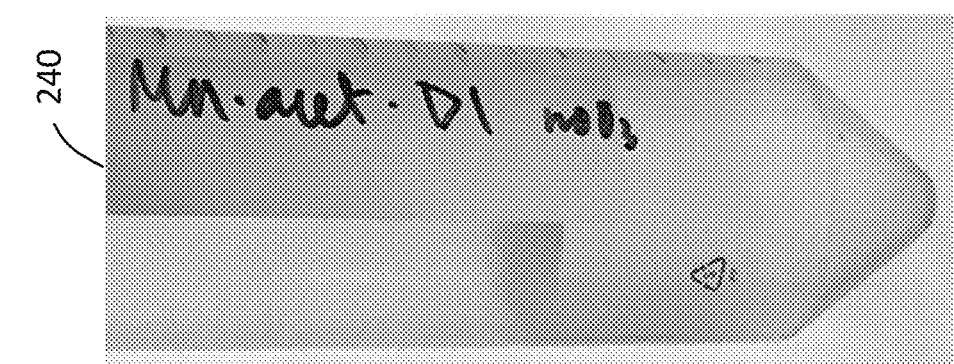
FIG. 12A is a photo of manganese (II) acetate in de-ionized water in which the water was not subject to ozone treatment.

FIG. 12A is a photo 240 of manganese (II) acetate in de-ionized water in which the water was not subject to ozone treatment. FIG. 12B is a photo 242 of manganese (II) acetate dissolved in de-ionized water, in which the de-ionized water was subject to 15 minutes of ozone treatment. The photos 240, 242 show that the color of the manganese (II) acetate solution in which the manganese (II) acetate was dissolved in ozone-treated de-ionized water has a darker color.

The following describes results of experiments that were performed for synthesizing lanthanide doped cerium oxide. In these experiments, a stoichiometric amount of cerium (III) nitrate was dissolved in 10 mL of ethanol, and gadolinium (III) nitrate was dissolved in 10 mL of ethanol. The cerium salt solution was mixed with the gadolinium salt solution and the mixture was subjected to ozone treatment for 30 minutes. The product was centrifuged at 4500 RPM for 15 minutes to settle the nanoparticles in the solution. The product was washed with ethanol and centrifuged again at 4500 RPM for 15 minutes. The product was finally vacuum dried. Similar syntheses were performed by replacing gadolinium nitrate with lanthanum nitrate, yttrium nitrate, praseodymium nitrate, and erbium nitrate to prepare lanthanide doped cerium oxides.

Figure 13B:
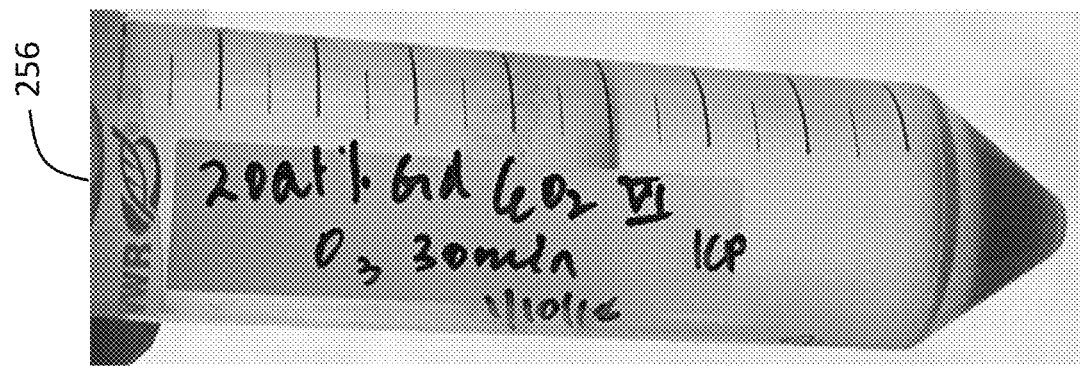
FIG. 13B is a photo showing the result obtained after mixing the cerium salt solution with the gadolinium salt solution and subjecting the mixture to ozone treatment.
Figure 13A:
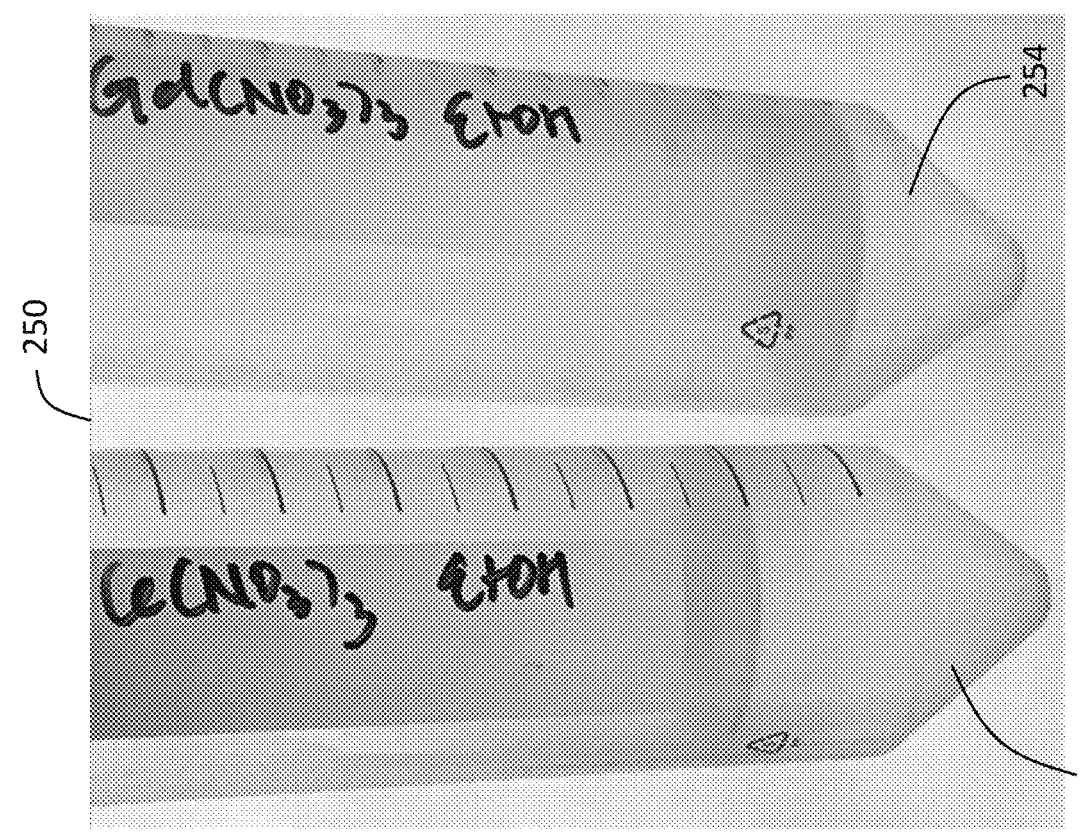
FIG. 13A is a photo of a solution of cerium (III) nitrate dissolved in ethanol, and a solution of gadolinium (III) nitrate dissolved in ethanol.

Referring to FIG. 13A, on the left of a photo 250 shows a solution 252 in which cerium (III) nitrate was dissolved in 10 mL of ethanol, and on the right of the photo 250 shows a solution 254 in which gadolinium (III) nitrate was dissolved in 10 mL of ethanol. FIG. 13B is a photo 256 showing the result obtained after mixing the cerium salt solution with the gadolinium salt solution and subjecting the mixture to ozone treatment for 30 minutes.

Inductively coupled plasma-optical emission spectrometry (ICP-OES) was used to analyze the lanthanide doped cerium oxide. The results of the ICP-OES analysis are shown in Table 1 below.

TABLE 1

| Different synthesized wt. % Gd-doped ceria | wt. % Gd detected by ICP-OES |
| --- | --- |
| 1 | 0.6 |
| 3 | 2.8 |
| 6 | 5.9 |

The inductively coupled plasma-mass spectrometry is used to determine the various metal components in the sample. For example, 1 wt. % of Gd-doped cerium oxide indicates that the relative wt. % of gadolinium in the sample is 1 wt. % of all metal ions in this sample (including cerium metal and gadolinium metal). Thus, if the sample contains 100 grams of metal atoms, 1 gram of the metal atoms are gadolinium. The numbers in the right column are actual wt. % numbers experimentally determined by the inductively coupled plasma-optical emission spectrometry. The numbers in the left column are rounded numbers.

Table 1 shows that the process described above can produce Gd doped ceria nanoparticles with a few atomic percent. This is significant because statistically for a 2 nm ceria particle, a 1 atomic percent doped ceria nanoparticle is almost equivalent to roughly 1 Gd atomic dopant per ceria particle. This material is novel compared to previously produced Gd doped ceria nanoparticles.

The following describes additional examples of rapid, room temperature synthesis of ceria nanocrystals using ozone. Examples of the materials and methods for synthesis of ceria nanocrystals are described, and results of the ceria nanocrystal synthesis are discussed.

Materials and Methods

Ceria nanocrystals (NCs) were synthesized by subjecting an ethanolic solution of different cerium salt (cerium (III) nitrate, cerium (III) chloride, and cerium (III) sulfate) to ozone treatment. For example, 0.5 g of cerium (III) nitrate hexahydrate ($Ce(NO_3)_3 \cdot 6H_2O$, 99.5% REacton®, Alfa Aesar) was dissolved in 20 mL 200-proof ethanol (Fisher Scientific). 200 SCCM of oxygen (Extra dry 99.6%, Matheson Tri-Gas) was passed through an MP-3000 multipurpose ozone generator (A2Z Ozone) to deliver a mixture of 0.5 g/h ozone-oxygen mixture to the cerium salt solution. In a typical experiment, this gas mixture was bubbled into the solution for 30 minutes at room temperature. The color of the solution changed from clear to yellow-orange with orange-red precipitate within 30 minutes. The obtained mixture was centrifuged at 4500 RPM for 20 minutes. The precipitate was resuspended in a fresh aliquot of ethanol and was centrifuged again using the same parameters. The as-synthesized red precipitate was then dried under vacuum and stored in a desiccator. Similar experiments were also performed using either cerium (III) chloride or cerium (III) sulfate hydrate instead. Further, this synthesis methodology can be used with any other primary or secondary alcohols such as methanol, isopropanol. This synthesis methodology can also be used with a tertiary alcohol, such as tertiary butanol.

The morphology and lattice structure of the as-synthesized material were characterized by transmission electron microscopy (TEM) using an FEI Tecnai Osiris S/TEM operated at 200 kV. The selected area electron diffraction (SAED) data of samples was indexed using the ICDD card #00-004-0593. The Raman analysis was performed on a DXR Raman microscope equipped with a 532 nm laser. The diffuse reflectance analysis was performed on a Lambda 1050 UV/Vis/NIR spectrophotometer equipped with a 60-mm integrating sphere.

Results and Discussion

The morphology, size distribution and lattice structure of the as-synthesized products were characterized using high-resolution transmission electron microscopy (HRTEM) and selected area electron diffraction (SAED) The as-synthesized product was red after drying in vacuum. FIG. 14 shows a photo 260 of samples of dry, as-synthesized ceria nanocrystals 262. HRTEM images of the product that revealed that nanocrystals of sizes from 2 nm to 5 nm were produced within 15 seconds of ozonating the cerium nitrate-ethanol solution. FIG. 15 shows an HRTEM image 270 of the as-synthesized ceria nanocrystals obtained after ozonating an ethanol solution of cerium (III) nitrate hexahydrate for 15 seconds. A circle 272 shows one ceria nanocrystal. In this example, the size distribution of the nanocrystals did not alter after bubbling ozone for an hour. SAED analysis showed the products as fluorite structured cerium oxide. FIG. 16 shows the SAED pattern 280 of ceria nanoparticles shown in FIG. 2.

To verify the versatility of the method, two other ethanol soluble cerium salts, cerium chloride and cerium sulfate were also evaluated using the same synthetic method. Significantly, the use of cerium (III) chloride salts also produced the red ceria nanocrystals. Note that we also evaluated other alcohols as solvents for this synthetic procedure. Besides primary alcohols (methanol, ethanol and 1-propanol), secondary alcohols including 2-propanol and tertiary alcohols were also found successful in the preparation of the ceria nanocrystals using the cerium (III) nitrate salts.

A room temperature method for the synthesis of ceria nanocrystals using ozone treatment has been described. This method produces ceria nanocrystals within 15 seconds of ozonating an ethanolic solution of cerium nitrate, making it a very rapid synthetic process. Other short chain primary and second alcohol solvents were found effective in promoting the synthetic process.

FIGS. 17A, 17B, and 17C show HRTEM images 290, 292, 294 of ceria nanoparticles conducted at different time points (15 seconds, 5 minutes, and 1 hour, respectively). The scale bar on the images is 5 nm. HRTEM analysis revealed that the sizes of the nanocrystals remained around 2-5 nm even on changing the ozonation time (i.e., 15 seconds, 5 minutes, and 1 hour). Individual nanocrystals 296, 298, 300 are circled for clarity.

FIGS. 17D, 17D, and 17F show SAED analysis 302, 304, 306 of ceria nanoparticles conducted at different time points (15 seconds, 5 minutes, and 1 hour, respectively). The scale bar on the images is 2 l/nm. SAED analysis showed the products as fluorite structured cerium oxide.

FIG. 18 is a graph 310 showing representative EDS spectra of ceria nanoparticles. The EDS spectra shows the presence of C, O, Ce and Cu. The Cu and C signal is from the carbon film present on the Cu TEM grid.

FIG. 19 is a graph 320 showing the Raman spectrum of ceria nanoparticles. The mode 322 near 450 cm$^{-1}$ represents the first order Raman active $F_{2g}$ mode of fluorite structured ceria. The mode 324 near 600 cm$^{-1}$ can be attributed to oxygen vacancy defects present in the ceria nanoparticles.

FIG. 20 is a graph 330 showing the diffuse reflectance spectrum of ceria nanoparticles. The nanoparticles were synthesized by bubbling ozone in the ethanolic solution of cerium nitrate for 30 minutes. The change of reflectance above 540 nm indicates that the nanoparticles are red in color.

The following describes atomic force microscopy images of oxides produced by using ozone. FIG. 21 is an atomic force microscopy image 340 of birnessite ($M_xMnO_2.nH_2O$ (M=H$^+$)) nanoparticles and aggregates made by ozonating an manganese salt solution. FIG. 22 is an atomic force microscopy image 350 of silicon oxide nanoparticles and aggregates made by ozonating an ethanol solution of tetraethoxysilane (TEOS). FIG. 23 is an atomic force microscopy image 360 of ruthenium oxide nanoparticles and aggregates made by ozonating an aqueous solution of ruthenium chloride.

The ozone-mediated method for the synthesis of ceria and transition metal oxide nanoparticles can be performed under ambient conditions, e.g., the reaction temperature can be in a range from 10° C. to 40° C. In some examples, the reaction solution can be heated at elevated temperatures below the boiling point of the solution or solvent. Due to the high reaction temperature, the crystallinity of the products will increase.

The following describes ozone-mediated synthesis of transition metal doped ceria-based materials. Certain transition metal ions (such as $Gd^{3+}$, $Y^{3-}$, $La^{3+}$, $Nd^{3+}$, $Sm^{3+}$, and $Zr^{4+}$), when incorporated in ceria's lattice, can tune both the $Ce^{3+}/Ce^{4+}$ ratio and the concentration of oxygen vacancy defects. Engineering ceria-based materials by adding dopants of varying ionic radii can significantly impact the catalytic performance of these nanomaterials, especially for biomedical applications. In addition to generating pure ceria nanoparticles, the ozonation-mediated synthetic method can also be applied to introduce transition metal dopants in the lattice of ceria to yield the "next generation" of ceria-based nanoparticle catalysts. In this case, a mixture of ozone and oxygen (or just ozone gas) is bubbled into an alcohol solution mixture of cerium (III) nitrate and the salt of the dopant metal.

For example, gadolinium-doped ceria (GDC) nanoparticles ($Gd_y$—$Ce_{1-y}O_x$ nanoparticles, in which y is the dopant fraction, and x is between 1.5 and 2) can be synthesized by bubbling ozone through a solution containing both cerium (III) nitrate and gadolinium (III) nitrate salts in ethanol for a period of time, e.g., 30 minutes. Experiments were conducted in which the three gadolinium dopant concentrations are 0.6 wt. % (0.5 at. %), 3 wt. % (2.7 at. %) and 6 wt. % (5.4 at. %). For the synthesis of 0.6 wt. % gadolinium-doped ceria nanoparticles, a 10-mL ethanolic solution containing 2.2 g of Ce(NO$_3$)$_3$.6H$_2$O was first mixed thoroughly with a 10-mL ethanolic solution containing 0.02 g of Gd(NO$_3$)$_3$.6H$_2$O. The resulting mixture was bubbled for 30 minutes with a stream of ozone gas (0.5 g/h) generated by passing 200 SCCM of extra dry 99.6% oxygen (Matheson Tri-Gas, Lincoln, Nebr.) through an ozone generator (MP-3000, A2Z Ozone, Louisville, Ky.). The reaction solution was observed to transform from a clear solution to an orange-red cloudy solution. Afterward, the reaction mixture was centrifuged at 4500 RPM for 15 minutes. The precipitated pellet was re-suspended in a fresh aliquot of ethanol and centrifuged again under the same conditions. The obtained orange-red pellet was dried under vacuum. Other doped ceria nanoparticles with different weight percentages of Gd were prepared in a similar manner except with corresponding amounts of $Gd(NO_3)_3.6H_2O$ while keeping the amount of $Ce(NO_3)_3.6H_2O$ (2.2 g) constant. 3 wt. % gadolinium-doped ceria nanoparticles were synthesized using 0.22 g of $Gd(NO_3)_3.6H_2O$ and 6 wt. % gadolinium-doped ceria nanoparticles was prepared with 0.56 g of $Gd(NO_3)_3.6H_2O$.

Referring to FIGS. 25A to 25E and 26A to 26D, the structure and composition of the gadolinium-doped ceria nanoparticles were examined by high resolution transmission electron microscopy (HRTEM), selected area electron diffraction (SAED), energy-dispersive X-ray, and inductively-coupled plasma optical emission spectroscopy (ICP-OES).

Figures 25A, 25B, 25C, 25D, 25E:
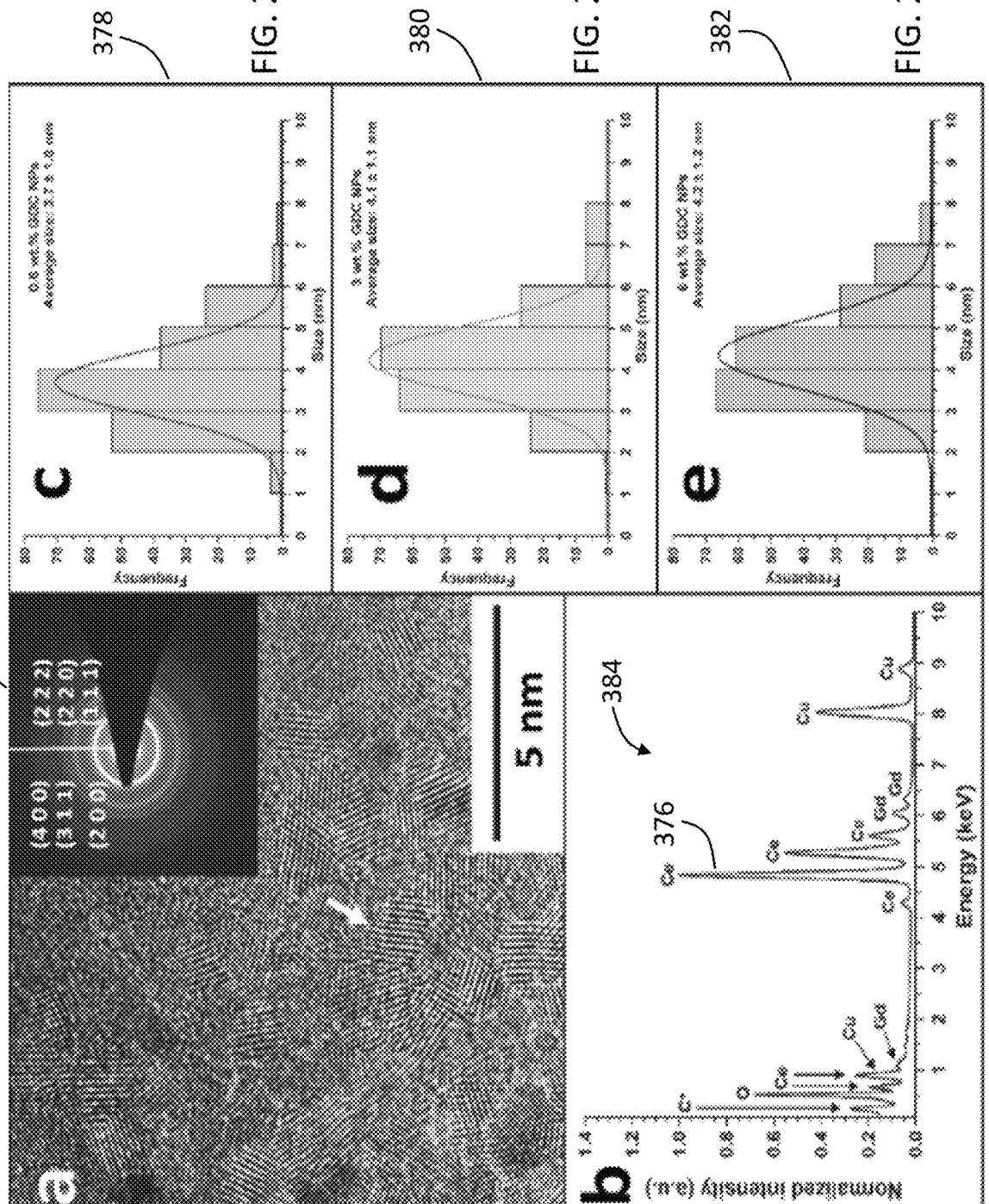
FIG. 25A is an HRTEM image of Gd-doped 0.6 wt. % ceria nanoparticles.
FIGS. 25B to 25E are graphs describing the chemical composition and size distribution of Gd-doped ceria nanoparticles.

FIG. 25A is an HRTEM image 370 with corresponding SAED pattern 372 associated with 0.6 wt. % Gd-doped ceria nanoparticles (GDC NPs) that were synthesized with 30 minutes of ozonation. A white arrow indicates a ceria nanoparticle. FIG. 25B is a graph 374 showing an EDS spectrum 384 of the 0.6 wt. % Gd-doped ceria nanoparticles. The data was normalized to the peak height of the Ce peak 376 appearing at 4.8 keV. FIGS. 25C to 25E are graphs 378, 380, 382 showing particle size distributions for 0.6 wt. %, 3 wt. %, and 6 wt. %, respectively, gadolinium-doped ceria nanoparticles synthesized with 30 minutes of ozonation.

Figures 26A, 26B, 26C, 26D:
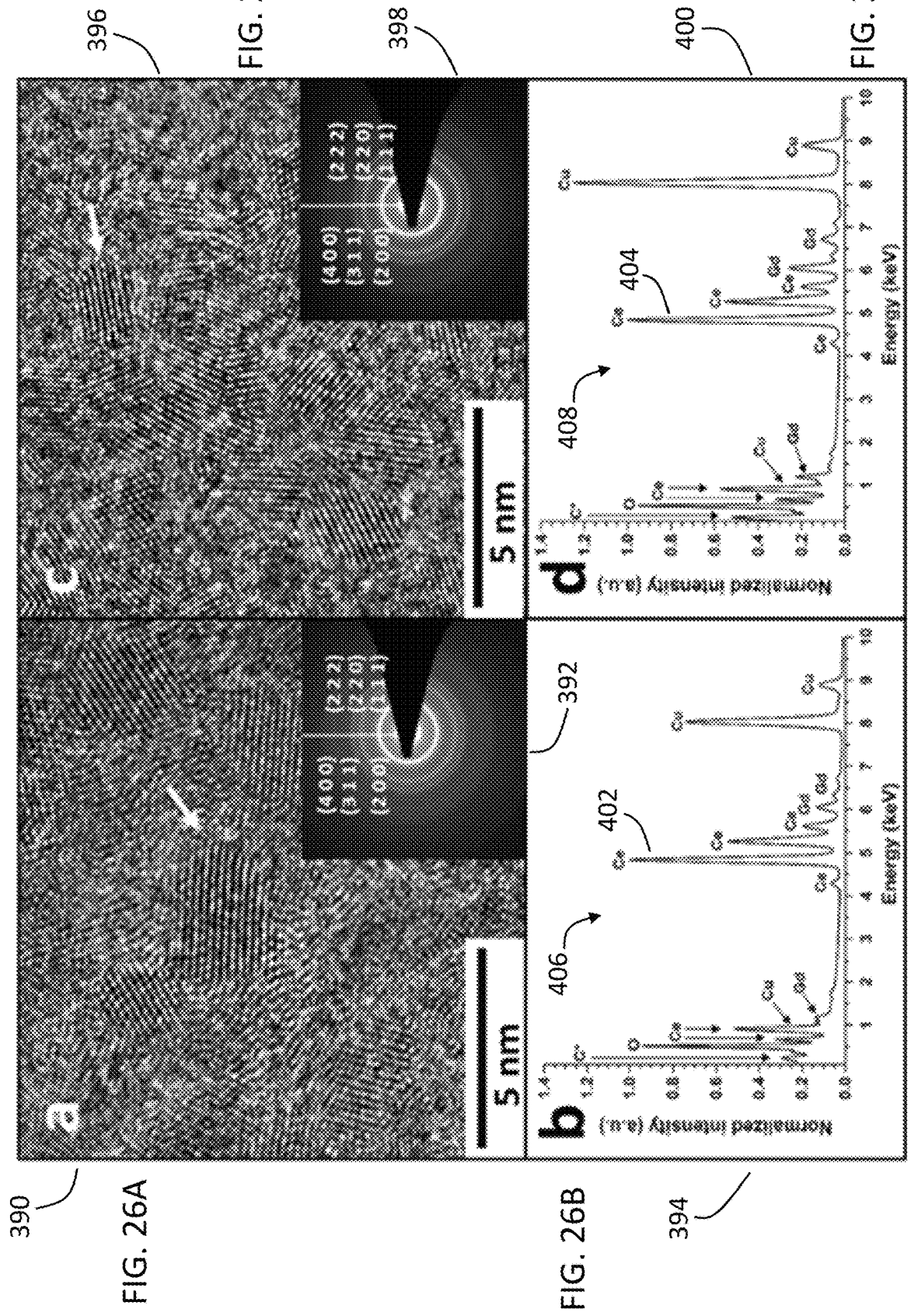
FIG. 26A is an HRTEM image of Gd-doped 3 wt. % ceria nanoparticles.
FIG. 26B is a graph showing the energy dispersive X-ray spectrum of Gd-doped 3 wt. % ceria nanoparticles.
FIG. 26C is an HRTEM image of Gd-doped 6 wt. % ceria nanoparticles.
FIG. 26D is a graph showing the energy dispersive X-ray spectrum of Gd-doped 6 wt. % ceria nanoparticles.

FIG. 26A is an HRTEM image 390 with corresponding SAED pattern 392 associated with 3 wt. % Gd-doped ceria nanoparticles that were synthesized with 30 minutes of ozonation. A white arrow indicates a ceria nanoparticle. FIG. 26B is a graph 394 showing an EDS spectrum 406 of the 3 wt. % Gd-doped ceria nanoparticles.

FIG. 26C is an HRTEM image 396 with corresponding SAED pattern 398 associated with 6 wt. % Gd-doped ceria nanoparticles that were synthesized with 30 minutes of ozonation. A white arrow indicates a ceria nanoparticle. FIG. 26D is a graph 400 showing an EDS spectrum 408 of the 6 wt. % Gd-doped ceria nanoparticles. The EDS data was normalized to the peak height of the Ce peak 402 at 4.8 keV.

The HRTEM images 370, 390, 396 and corresponding SAED patterns 372, 392, 398 showed that the three gadolinium doped ceria nanoparticles were composed of nano-sized crystallites. SAED analysis of the three doped ceria samples revealed the presence of distinct diffraction rings corresponding to (1 1 1), (2 0 0), (2 2 0), (3 1 1), (2 2 2), and (4 0 0) lattice planes of fluorite-structured ceria. The crystallite sizes of the three gadolinium-doped ceria nanoparticles ranged from 2 nm to 5 nm.

Sometimes, the as-synthesized particles may have comparatively low crystallinity or are too small to be separated and harvested by centrifugation. To overcome these limitations, the ozone-mediated synthesis process can be combined with solvothermal synthesis to improve the crystallinity of ceria-based nanomaterials. One successful application of this methodology has been applied to synthesize zirconium-doped ceria nanoparticles (Zr-doped ceria nanoparticles or ZDC nanoparticles).

For example, cerium (III) nitrate in ethanol was mixed with an ethanolic solution of zirconium (IV) chloride. This mixture was then exposed to ozone bubbling treatment for 30 minutes. The resulting solution was transferred to a 45 mL Teflon-lined autoclave and was heated for 4 hours at 120° C. The resulting mixture was centrifuged, and the light brown precipitated product was air-dried overnight. The lattice structure of the product was investigated using a Hitachi transmission electron microscope and a Rigaku Multiflex diffractometer (Rigaku, The Woodlands, Tex., USA) with Cu Kα radiation ($\lambda$=1.54 Å).

Figure 27:
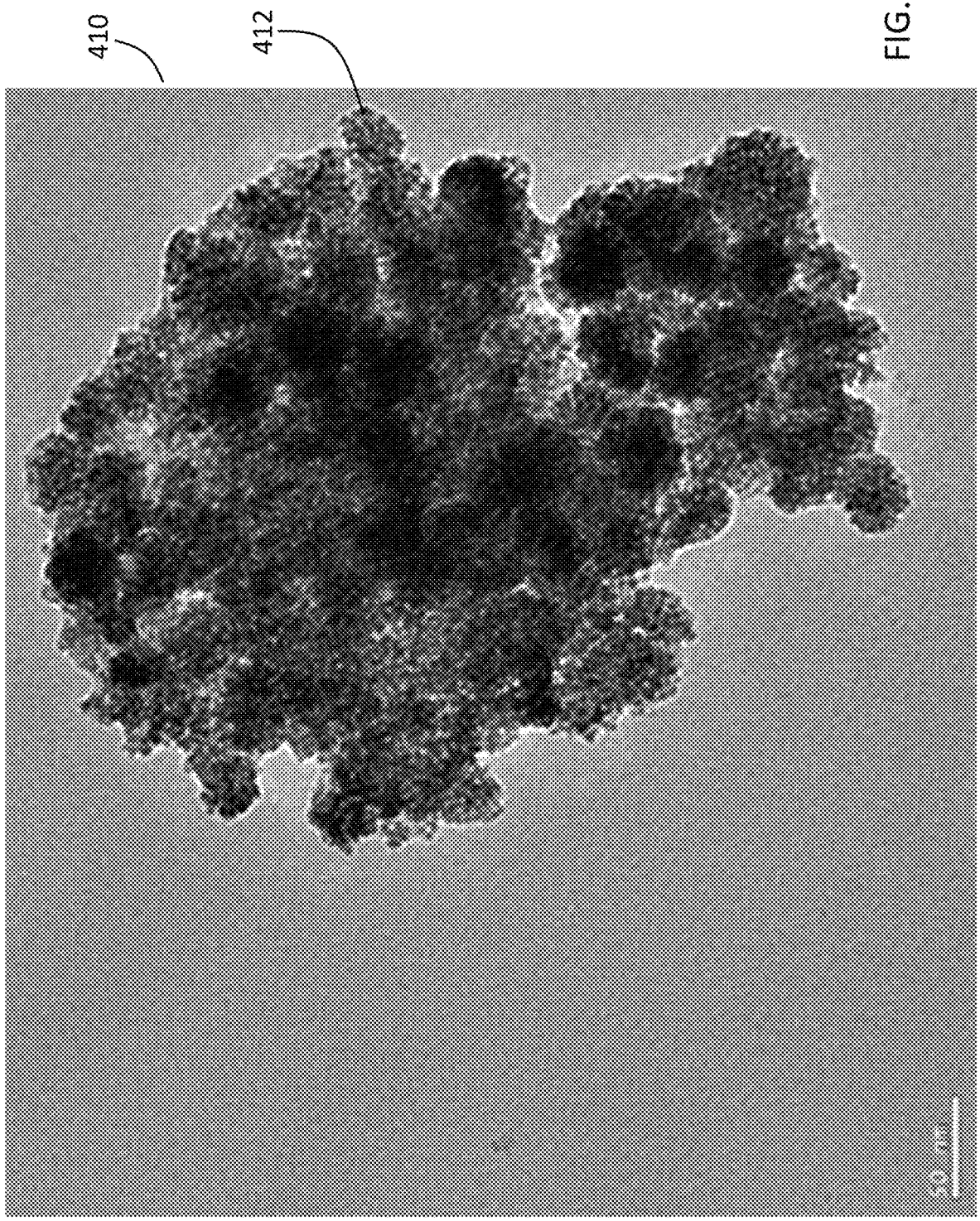
FIG. 27 is an HRTEM image of Zr-doped ceria nanoparticles.

FIG. 27 is an HRTEM image 410 of zirconium doped ceria nanoparticles (ZDC NPs) 412 synthesized with 30 minutes of ozonation and a follow-up solvothermal treatment at 120° C. for 4 hours. The nanoparticles 412 further aggregate into particles of size about 20-40 nm.

Figures 28A, 28B:
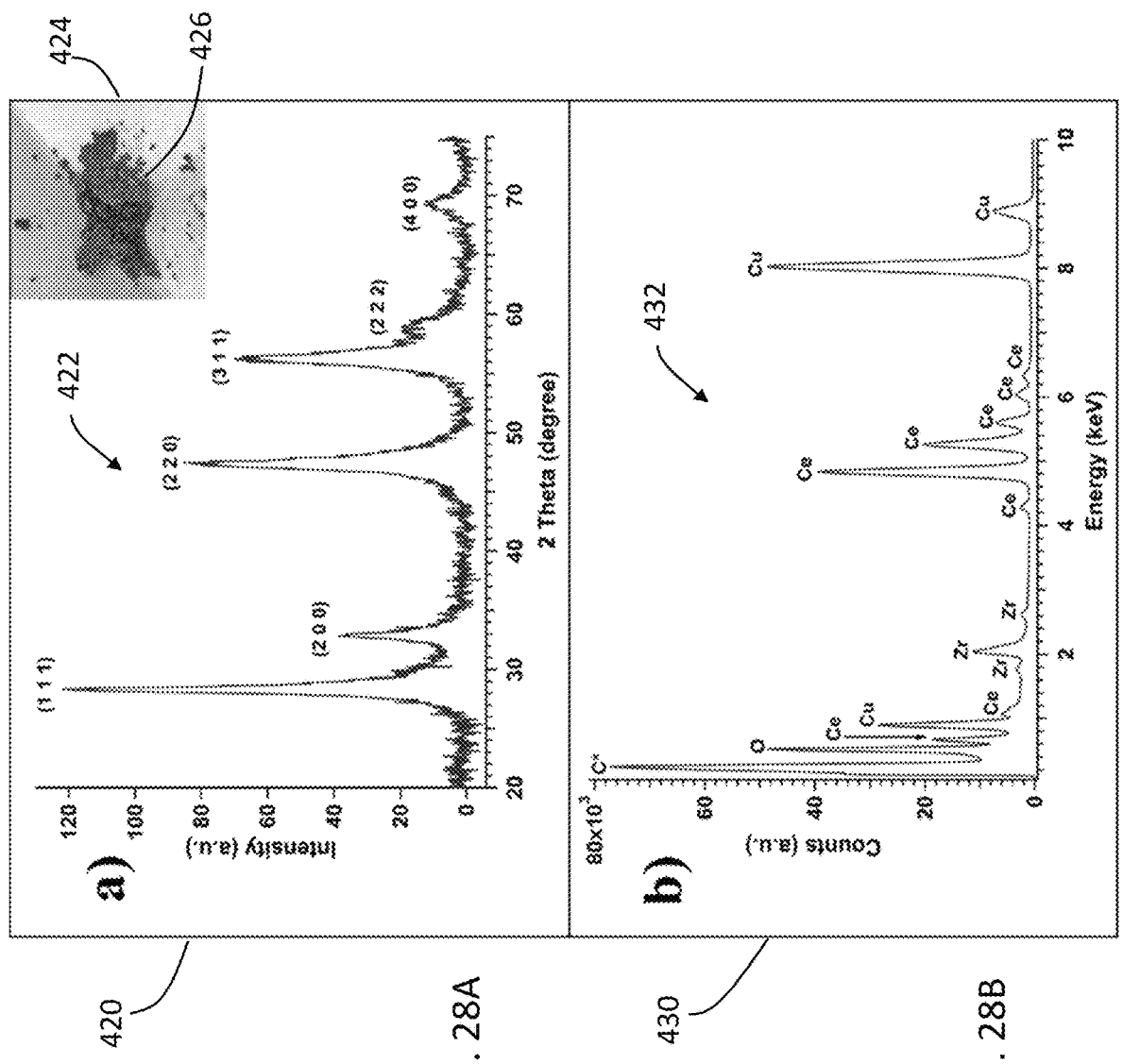
FIGS. 28A and 28B are graphs describing the lattice structure and chemical composition of the Zr-doped ceria nanoparticles.

FIG. 28A is a graph 420 showing an XRD pattern 422 of zirconium-doped ceria made with a combination of the ozonation and solvothermal treatments. An inset shows a photographic image 424 of the zirconium-doped ceria 426. The XRD pattern 422 was indexed according to the ICCD card #00-004-0593 of fluorite-structured ceria. The diffraction peaks in the XRD pattern 422 corresponded well with that of fluorite structured ceria (00-004-0593). Note that the XRD pattern 422 has sharper peaks than those of ceria nanoparticles made with the ozonation process without the solvothermal treatment. The results suggest that the combined ozone-mediated strategy with solvothermal treatment can significantly improve the crystallinity of the products.

FIG. 28B is a graph 430 showing an energy dispersive X-ray spectrum (EDX) 432 of zirconium-doped ceria. The elemental composition of the product was confirmed by the EDX spectrum data 432, which verifies the presence of zirconium, cerium, and oxygen in the sample.

The following describes applications of transition metal doped ceria-based materials. The ceria nanoparticles and transition metal doped ceria-based nanoparticles typically have high density of oxygen vacancy defects and thus have catalytic activities towards certain types of chemical reactions. Particularly, these nano-size ceria-based materials, together with their high surface Ce3+/Ce4+ ratio and the potential of cerium ions to rapidly convert between the two oxidation states, makes them attractive for the generation and scavenging of reactive oxygen species (ROS) for biological applications and waste water treatment. Reactive oxygen species is a family of highly potent oxidizing and nitrating molecules ($O_2^-$, .OH, $H_2O_2$, .NO and $ONOO^-$).

The chief pathways of reactive oxygen species generation in living beings includes: (1) Reaction of physical agents (ionization radiation, ultraviolet radiation or ultrasound) with cells, (2) Autoxidation of redox active compounds by metal ions (iron or copper), and (3) Formation in metabolic pathways. These species, naturally occurring in plants, animals and most eukaryotic organisms, are called as a "necessary evil" due to their dual-beneficial as well as detrimental role in biological systems. Owing to their varying levels of reactivity, production sites and ability to cross biological membranes, reactive oxygen species find applications in cells as signaling molecules. The reactive oxygen species also assist in basic biological processes such as cellular growth and differentiation. Simultaneously, the reactive oxygen species are deemed as toxic by-products of aerobic metabolism and have been associated with deleterious events including cardiovascular diseases, neurodegenerative illnesses, cancer, inflammation, and ageing.

With a lifetime of barely 2 nanoseconds in aqueous solutions, hydroxyl radicals (.OH) are unstable reactive oxygen species that can easily damage a range of macromolecules including lipids, nucleic acids, carbohydrates and amino acids. At the same time, these reactive radicals are also environmentally vital since they can remove bacteria, organic and inorganic pollutants in wastewater and groundwater by advanced oxidation processes (AOP). .OH can also be synthetically generated from hydrogen peroxide ($H_2O_2$) in the presence of redox catalysts such as transition metal ions ($Cr^{3+}$, $Mn^{x+}$, $Fe^{2+}$, $Co^{2+}$, $Cu^+$, $Al^{3+}$, $Ru^{x+}$, and $Ce^{3+}$), metal oxides and polyoxometalates. The transformation can follow Fenton, Fenton-like or Haber-Weiss reaction. These reactions are dependent on $H_2O_2$ concentration, catalyst/$H_2O_2$ ratio, pH and reaction time. Although the exact mechanism is controversial and under debate, using $Ce^{3+}$ as an example the chemical reaction is as follows:

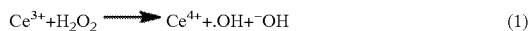   (1)

   (2)

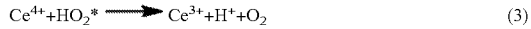   (3)

   (4)

Fluorite-structured cerium oxide (ceria) nanoparticles on account of their redox cycling behavior and inherent oxygen vacancy defects display exemplary catalytic as well as multi-enzyme-mimetic properties. Nano-ceria through a series of Fenton-like redox reactions, can not only generate but also scavenge reactive oxygen species. The process of production and annihilation of reactive oxygen species by ceria is highly dependent on both the redox state of cerium ions as well as their concentration in the system. As a result of these unique features, ceria can be used therapeutically for, e.g., (1) Protection against radiation, (2) Reduction of ischemic stroke, (3) Cancer biomarker, (4) Anti-inflammatory and anti-oxidant drugs and, (5) Cardiovascular and neurodegenerative disorder treatment. $Ce^{4+}$ within the lattice of ceria has also been substituted with a host of transition and lanthanide cations of varying ionic radii. The purpose of doping ceria is to increase both the oxygen vacancies and $3^+/4^+$ ratio within the system. This strategy enhanced the doped material's catalytic activity towards reactive oxygen species generation and annihilation.

Figure 29:
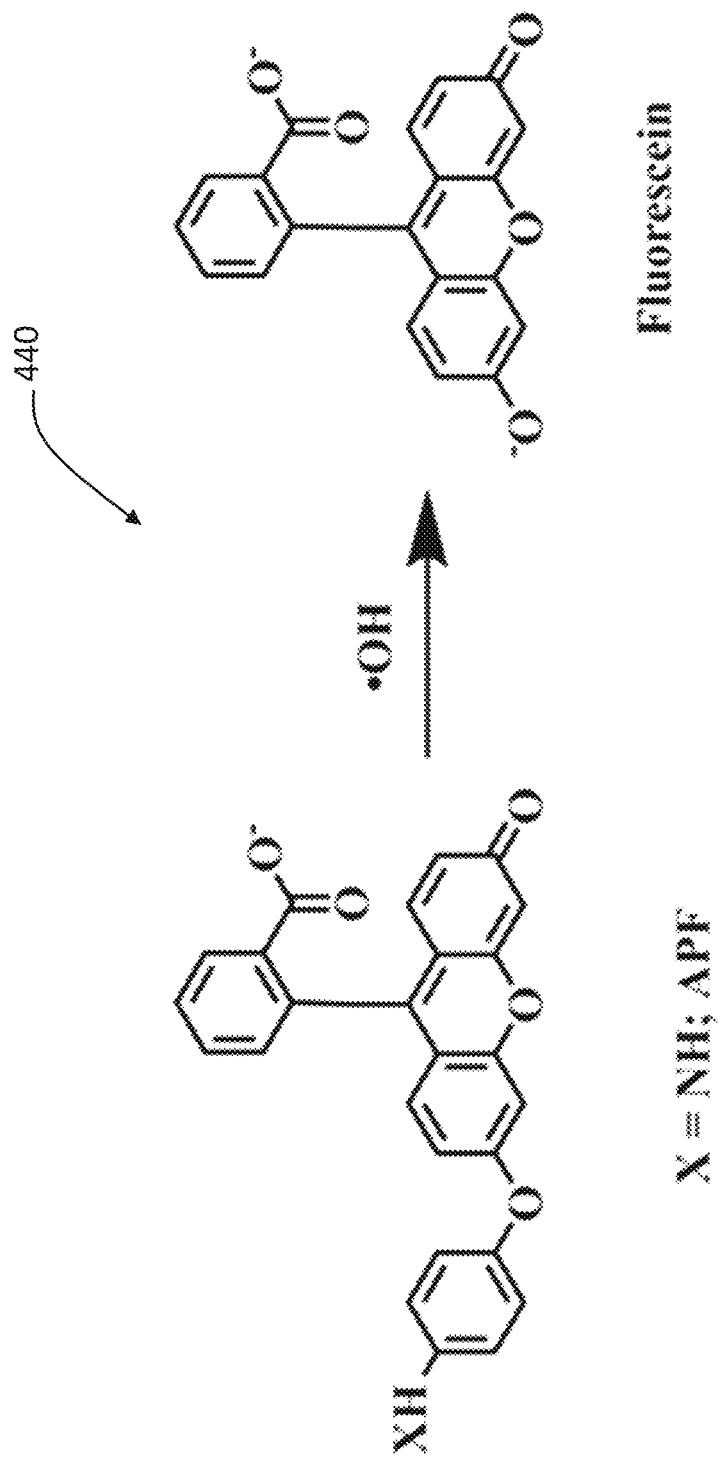
FIG. 29 shows a reaction depicting the chemical scheme to detect hydroxyl radicals.

.OH has damaging effects to living beings. In photocatalysis, .OH production has been detected by the following techniques: (1) Laser-induced-fluorescence (LIF) method, (2) Spin trapping ESR method, (3) Chemiluminescence reaction with .OH, (4) Fluorescence products with .OH. Methods such as LIF can be used to identify .OH in the gaseous phase while reactants in spin trapping measurements are susceptible to oxidation thereby reducing the efficacy of some of these analytical techniques. Highly sensitive fluorescence spectroscopy can be used for .OH detection. Fluorescent probes have been developed for .OH identification. Among the probes, 2-[6-(4'-Amino) phenoxy-3H-xanthen-3-on-9-yl] benzoic acid (aka APF) was found to be not only very sensitive and selective towards .OH detection but can also resist autoxidation. Upon reaction with .OH, the aminophenyl ring of the non-fluorescent APF undergoes cleavage eventually transforming APF into a fluorescent molecule. FIG. 29 shows a reaction 440 between APF dye and hydroxyl radicals. Hence, an increase in the concentration of .OH will subsequently enhance the signal during fluorimetric measurements.

To demonstrate this application, we have evaluated the catalytic activity of different Gd-doped ceria catalysts by measuring the initial catalytic production rates of hydroxyl radicals (.OH) from the disproportionation of hydrogen peroxide ($H_2O_2$) at different reaction temperatures (e.g., 15, 21.8, 25, 30, and 35° C.). The temperature-dependent rate data was then used to compose Arrhenius plots to yield the apparent activation energy values for catalyst activity comparisons. Each rate measurement was performed with 0.6 mM aqueous $H_2O_2$ and 0.1 g/L catalyst in a 0.1 M TRIS aqueous buffer at pH=7.4.

Details for the method is as follows. First, the stock solution of aqueous $H_2O_2$ (2 mM) was prepared with 0.1 M aqueous TRIS buffer at pH=7.4, whereas that of the APF dye (1 mM) was prepared in vacuum-sonicated methanol. To prepare the stock solution of a catalyst, 6 mg of the selected catalyst was added to a 30 mL TRIS buffer solution, followed by 20 min of sonication and 10 min of stirring. To constitute the reaction mixture for each rate measurement, 1.5 mL of the catalyst stock solution was added to an FUV quartz cell, followed by subsequent additions of 600 µL of TRIS buffer, 900 µL of 2 mM $H_2O_2$, and then 30 µL of 1 mM APF dye. The final concentrations of the reactants were 0.1 g/L catalyst, 0.6 mM $H_2O_2$, and 10 µM APF dye. The temperature of the cell was controlled by a circulating temperature bath connected to the cell holder. During the measurement, the solution mixture was continuously stirred to maintain the uniformity of temperature and catalyst suspension. The non-fluorescent APF dye was reported to chemo-selectively react with .OH to generate fluorescein. To comparatively quantify the production rate of .OH, the fluorescence of the reaction mixture was monitored at 515 nm (with excitation at 490 nm) in kinetics mode on a FluoroMax-4 fluorimeter (Horiba Jobin Yvon, Edison, N.J.) at intervals of 30 sec for a total of 5 min Similar control experiments without the catalysts were conducted at the five evaluated temperatures. All the experiments were performed in triplicates. Control experiments with commercial gadolinium (III) oxide ($Gd_2O_3$) were also similarly performed.

Figure 30:
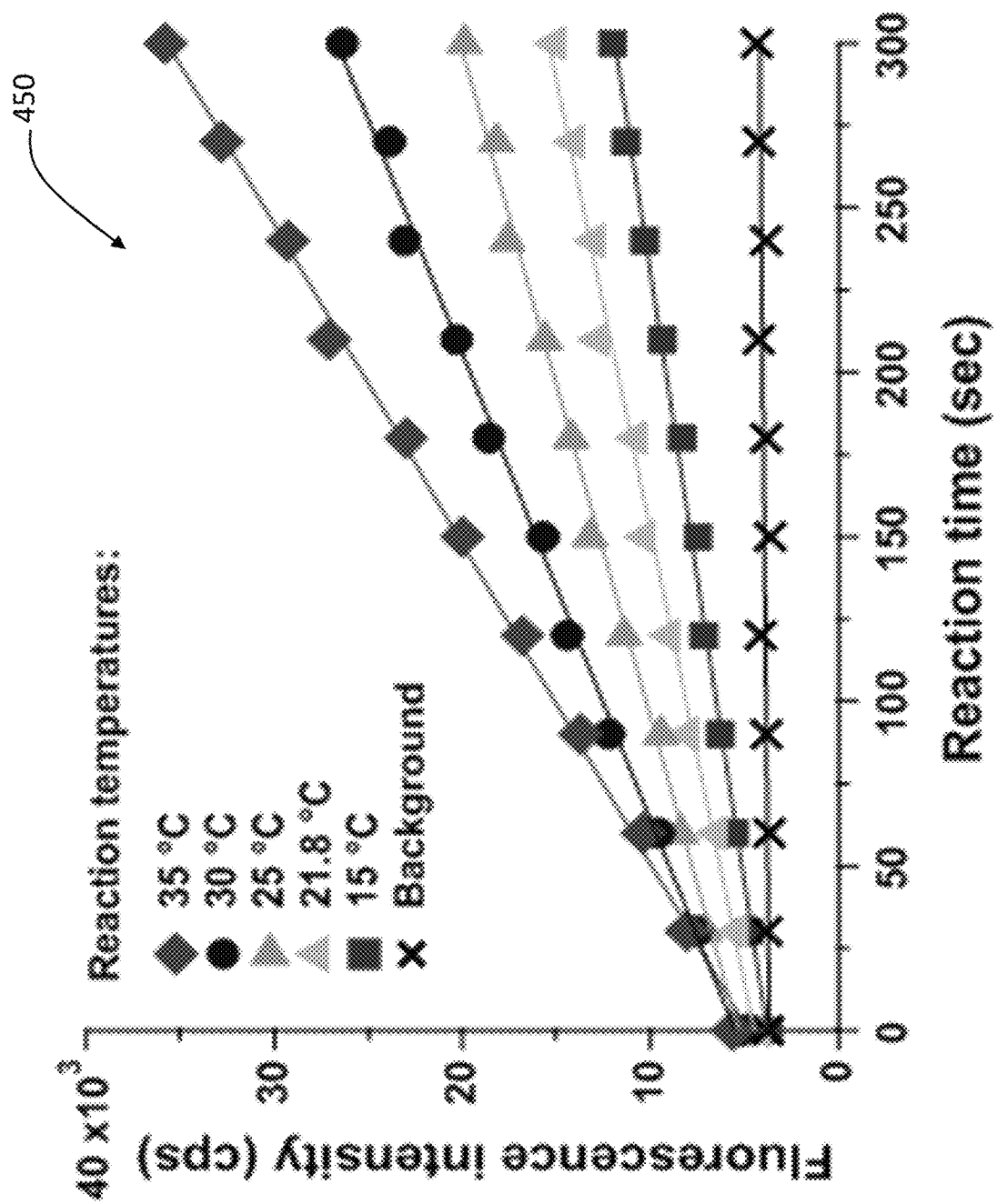
FIGS. 30 to 32 are graphs describing the catalytic generation of hydroxyl radicals by the Gd-doped ceria nanoparticles and gadolinium oxide.

For our gadolinium-doped ceria catalyst system, fluorescence intensity versus reaction time plots were recorded to monitor the initial production rates of .OH with the three gadolinium-doped ceria nanoparticles. FIG. 30 is a graph 450 showing plots of fluorescence intensity vs. reaction time for the generation of hydroxyl radicals from hydrogen peroxide catalyzed by 0.6 wt. % gadolinium-doped ceria nanoparticles.

Figure 31:
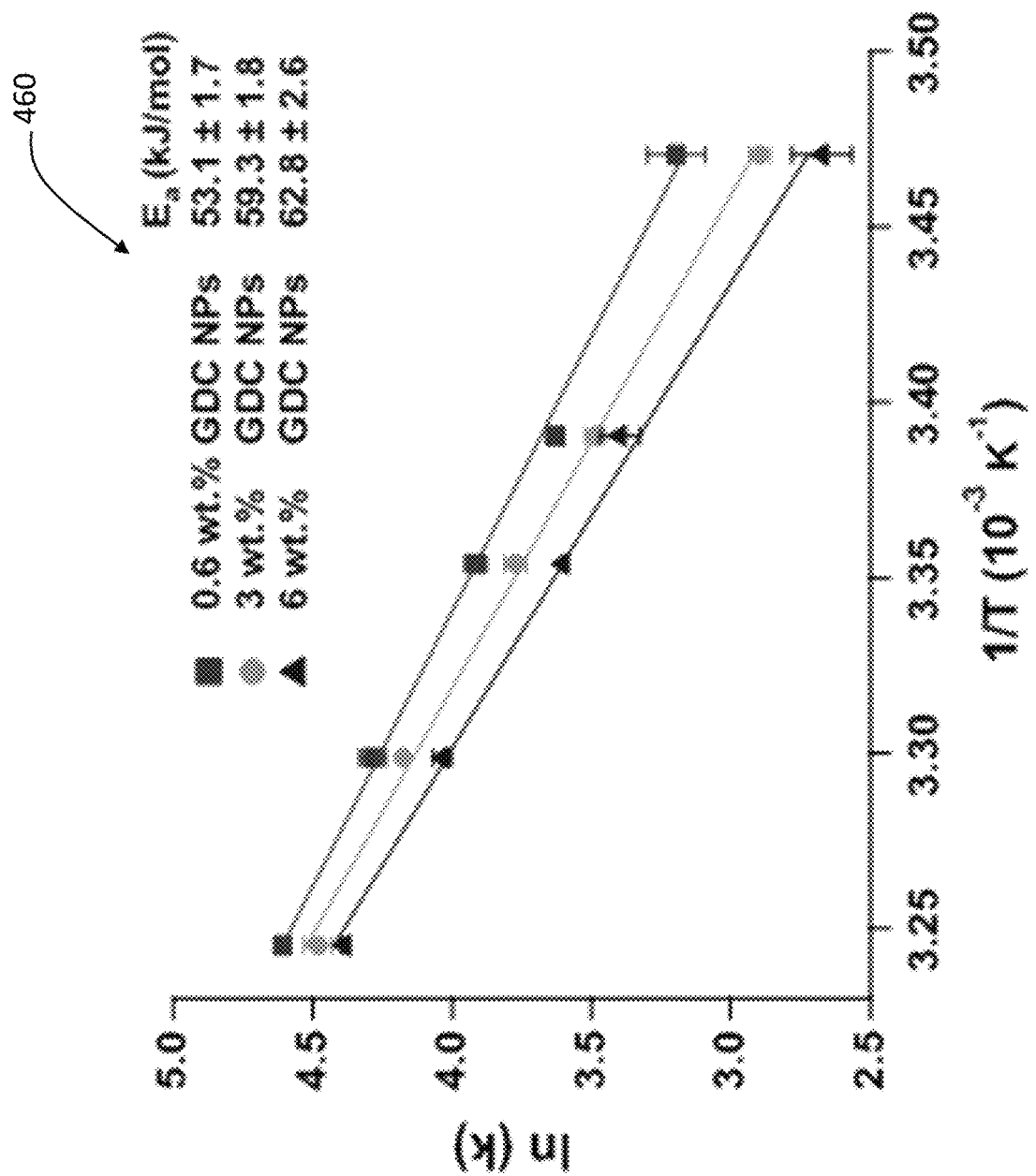
Figure 32:
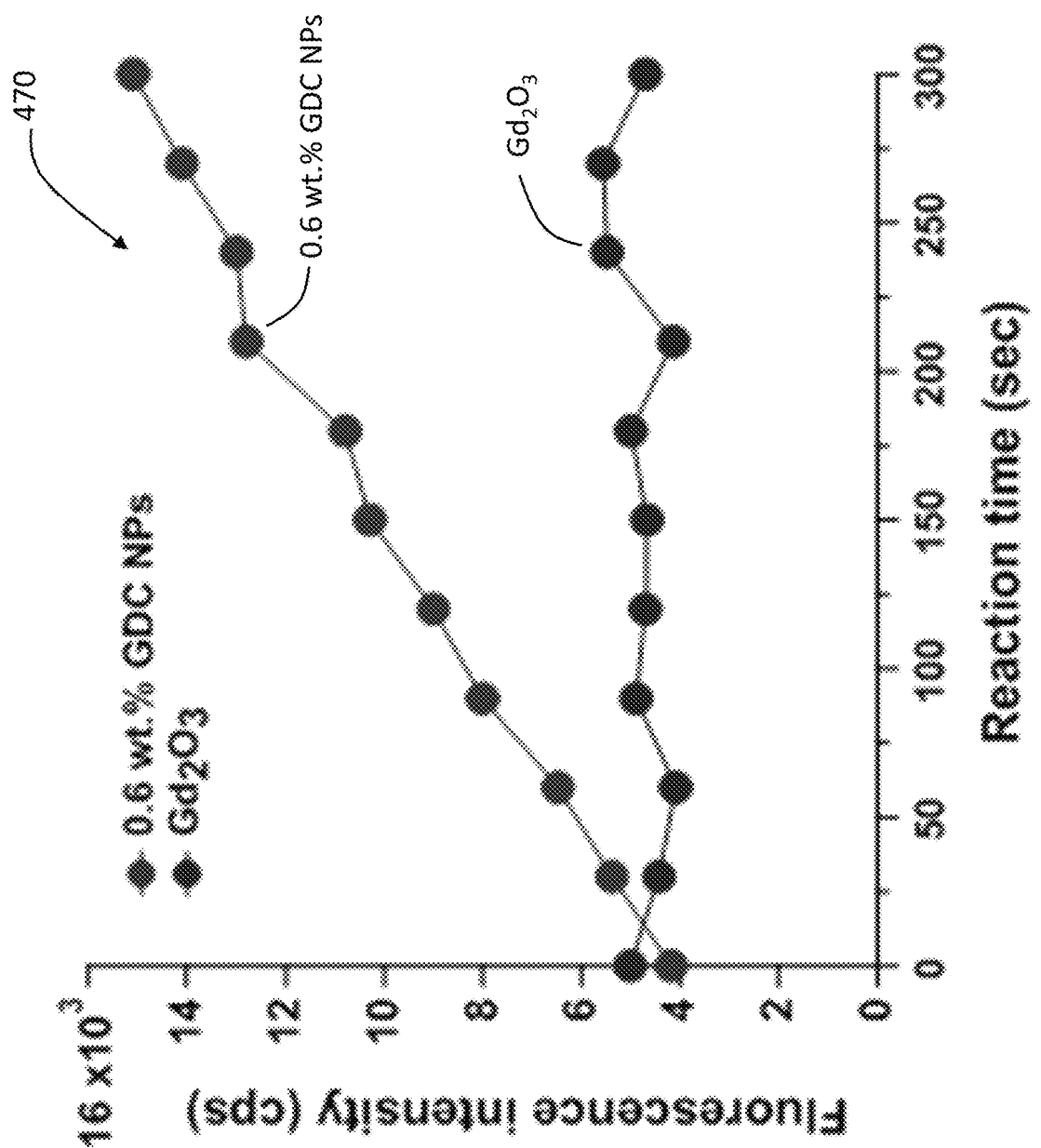

A rise in the evaluated reaction temperature led to an increase in the slopes (or apparent initial rates, k) of these plots. Arrhenius plots (ln(k) versus 1/T) were constructed to deduce the apparent activation energy values for the three evaluated gadolinium-doped ceria nanoparticles catalysts. FIG. 31 is a graph 460 showing Arrhenius plots for the generation of hydroxyl radicals from hydrogen peroxide catalyzed by gadolinium-doped ceria nanoparticles. The catalytic activity of bulk gadolinium (III) oxide was found to be negligible when compared to those of the three gadolinium-doped ceria nanoparticles. FIG. 32 is a graph 470 showing reaction kinetics of catalytic generation of hydroxyl radicals with 0.6 wt. % gadolinium-doped ceria, $Gd_2O_3$. The reaction conditions are: reaction temperature: 21.8° C.; [$H_2O_2$]=0.6 mM; [0.6 wt. % gadolinium-doped ceria]=0.1 g/L; [$Gd_2O_3$]=0.1 g/L.

The apparent activation energy values for 0.6 wt. %, 3 wt. %., and 6 wt. % gadolinium-doped ceria nanoparticles were found to be 53.1±1.7 kJ/mol, 59.3±1.8 kJ/mol, and 62.8±2.6 kJ/mol, respectively. The increasing trend of apparent activation energy values positively correlated with an increase in the gadolinium dopant level in the gadolinium-doped ceria nanoparticles. The apparent activation energy for 0.6 wt. % gadolinium-doped ceria nanoparticles was comparable to that of palladium-based catalysts (53-55 kJ/mol), which were commonly accepted as standards for evaluating the $H_2O_2$ decomposition reaction. A rise in the concentration of gadolinium may increase the percentage of $Ce^{3+}$ in doped ceria systems, thereby improving the catalytic ability of their Lewis acid and base sites. Although the percentage of $Ce^{3+}$ increased with the amount of gadolinium, the reactive oxygen species catalytic activity for 0.6 wt. % gadolinium-doped ceria nanoparticles surpassed that of 6 wt. % gadolinium-doped ceria nanoparticles. Our data illustrates that the reactive oxygen species catalytic activities of ceria nanoparticles can be enhanced by adding optimum concentration of transition metal dopants to the ceria lattice structures.

Although some examples have been discussed above, other implementations and applications are also within the scope of the following claims. For example, non-metal oxide nanoparticles can be produced using ozone. A gas that includes ozone is provided to a solution that includes a precursor material, such as tetraethoxysilane (TEOS). After ozone treatment, a precipitate can be produced from the solution, and the precipitate can be dried to produce oxide nanoparticles, such as silicon oxide nanoparticles. The silicon oxide nanoparticles can have dimensions in a range from about 1 nm to about 2 nm. The process for producing silicon oxide can be performed in room temperature.

What is claimed is:

1. A method of producing ceria nanocrystals, the method comprising:
   providing a gas comprising ozone to a first solution comprising a cerium salt, wherein the first solution comprises a primary alcohol; and
   obtaining ceria nanocrystals from the first solution after the gas is provided to the first solution.

2. The method of claim 1 in which the gas comprises a mixture of oxygen and ozone.

3. The method of claim 1 in which the cerium salt comprises at least one of cerium (III) nitrate or cerium (III) chloride.

4. The method of claim 1 in which the gas is bubbled into the first solution.

5. The method of claim 1, comprising causing the first solution to change from clear to yellow-orange.

6. The method of claim 5, comprising generating a first precipitate in the first solution.

7. The method of claim 6, comprising applying a centrifugal process to a solution that includes material from the first precipitate to produce a second precipitate.

8. The method of claim 7 in which at least a portion of the second precipitate is at least one of red or orange-red.

9. The method of claim 8, comprising drying the second precipitate to produce the ceria nanocrystals.

10. The method of claim 6 in which at least a portion of the first precipitate is orange-red.

11. The method of claim 1, in which the first solution consists essentially of a primary alcohol.

12. The method of claim 1 in which the first solution comprises at least one of ethanol, methanol, or 1-propanol.

13. The method of claim 1 in which providing the gas to the first solution and obtaining ceria nanocrystals from the first solution are performed at room temperature.

14. The method of claim 1 in which providing the gas to the first solution and obtaining ceria nanocrystals from the first solution are performed at a temperature in a range from 10° C. to 30° C.

15. The method of claim 1 in which at least some of the ceria nanocrystals have dimensions in a range from 2 nm to 6 nm.

16. The method of claim 1 in which the ceria nanocrystals comprise fluorite structured cerium oxide.

17. The method of claim 1 in which the ceria nanocrystals are obtained from the first solution after the gas is provided to the first solution for a duration of less than one minute.

* * * * *